(12) United States Patent
Rothkopf et al.

(10) Patent No.: US 9,654,104 B2
(45) Date of Patent: May 16, 2017

(54) RESISTIVE FORCE SENSOR WITH CAPACITIVE DISCRIMINATION

(75) Inventors: Fletcher R. Rothkopf, Mountain View, CA (US); Stephen P. Zadesky, Cupertino, CA (US)

(73) Assignee: Apple Inc., Cupertino, CA (US)

(\*) Notice: Subject to any disclaimer, the term of this patent is extended or adjusted under 35 U.S.C. 154(b) by 1486 days.

(21) Appl. No.: 11/826,645

(22) Filed: Jul. 17, 2007

(65) Prior Publication Data

US 2009/0019949 A1   Jan. 22, 2009

(51) Int. Cl.
*G06F 3/044* (2006.01)
*H03K 17/96* (2006.01)
*H03K 17/955* (2006.01)

(52) U.S. Cl.
CPC ....... *H03K 17/9625* (2013.01); *H03K 17/955* (2013.01); *G06F 2203/0382* (2013.01); *H03K 17/962* (2013.01); *H03K 2217/94026* (2013.01); *H03K 2217/96031* (2013.01); *H03K 2217/96054* (2013.01)

(58) Field of Classification Search
CPC ...................................... G06F 3/044
USPC ................................ 345/173–177
See application file for complete search history.

(56) References Cited

U.S. PATENT DOCUMENTS

| | | | |
|---|---|---|---|
| 1,061,578 A | 5/1913 | Wischhusen et al. | |
| 2,798,907 A | 7/1957 | Schneider | |
| 2,903,229 A | 9/1959 | Landge | |
| 2,945,111 A | 7/1960 | McCormick | |
| 3,005,055 A | 10/1961 | Mattke | |
| 3,965,399 A | 6/1976 | Walker et al. | |
| 4,103,252 A | 7/1978 | Bobick | |
| 4,110,749 A | 8/1978 | Janko et al. | |
| 4,115,670 A | 9/1978 | Chandler | |
| 4,121,204 A | 10/1978 | Welch et al. | |
| 4,129,747 A | 12/1978 | Pepper | |
| 4,158,216 A | 6/1979 | Bigelow | |
| 4,242,676 A | 12/1980 | Piguet et al. | |
| 4,246,452 A | 1/1981 | Chandler | |
| 4,264,903 A | 4/1981 | Bigelow | |
| 4,293,734 A | 10/1981 | Pepper, Jr. | |
| D264,969 S | 6/1982 | McGoutry | |
| 4,380,007 A | 4/1983 | Steinegger | |

(Continued)

FOREIGN PATENT DOCUMENTS

| CN | 1139235 A | 1/1997 |
|---|---|---|
| CN | 1455615 | 11/2003 |

(Continued)

OTHER PUBLICATIONS

SanDisk Sansa Connect User Guide; 29 pages.

(Continued)

*Primary Examiner* — Dennis Joseph
(74) *Attorney, Agent, or Firm* — Morrison & Foerster LLP

(57) ABSTRACT

A resistive force sensor with capacitive discrimination is disclosed. According to an example of the disclosure, a sensor is directed to detect resistance and capacitance in an alternating fashion, the resistance indicating a force being applied to an input area of a device, and the capacitance indicating a proximity of a body part to the input area of the device, and the detected resistance and capacitance are utilized to determine whether the body part has pressed the input area of the device.

19 Claims, 15 Drawing Sheets

(56) References Cited

U.S. PATENT DOCUMENTS

| | | |
|---|---|---|
| 4,380,040 A | 4/1983 | Posset |
| 4,475,008 A | 10/1984 | Doi et al. |
| 4,570,149 A | 2/1986 | Thornburg et al. |
| 4,587,378 A | 5/1986 | Moore |
| 4,644,100 A | 2/1987 | Brenner et al. |
| 4,719,524 A | 1/1988 | Morishima et al. |
| 4,734,034 A | 3/1988 | Maness et al. |
| 4,736,191 A | 4/1988 | Matzke et al. |
| 4,739,191 A | 4/1988 | Puar |
| 4,739,299 A | 4/1988 | Eventoff et al. |
| 4,752,655 A | 6/1988 | Tajiri et al. |
| 4,755,765 A | 7/1988 | Ferland |
| 4,764,717 A | 8/1988 | Tucker et al. |
| 4,798,919 A | 1/1989 | Miessler et al. |
| 4,810,992 A | 3/1989 | Eventoff |
| 4,831,359 A | 5/1989 | Newell |
| 4,849,852 A | 7/1989 | Mullins |
| 4,856,993 A | 8/1989 | Maness et al. |
| 4,866,602 A | 9/1989 | Hall |
| 4,876,524 A | 10/1989 | Jenkins |
| 4,897,511 A | 1/1990 | Itaya et al. |
| 4,914,624 A | 4/1990 | Dunthorn |
| 4,917,516 A | 4/1990 | Retter |
| 4,951,036 A | 8/1990 | Grueter et al. |
| 4,976,435 A | 12/1990 | Shatford et al. |
| 4,990,900 A | 2/1991 | Kikuchi |
| 5,008,497 A | 4/1991 | Asher |
| 5,036,321 A | 7/1991 | Leach et al. |
| 5,053,757 A | 10/1991 | Meadows |
| 5,125,077 A | 6/1992 | Hall |
| 5,159,159 A | 10/1992 | Asher |
| 5,179,648 A | 1/1993 | Hauck |
| 5,186,646 A | 2/1993 | Pederson |
| 5,192,082 A | 3/1993 | Inoue et al. |
| 5,231,326 A | 7/1993 | Echols |
| 5,237,311 A | 8/1993 | Mailey et al. |
| 5,270,710 A | 12/1993 | Gaultier et al. |
| 5,278,362 A | 1/1994 | Ohashi |
| 5,305,017 A | 4/1994 | Gerpheide |
| 5,313,027 A | 5/1994 | Inoue et al. |
| D349,280 S | 8/1994 | Kaneko |
| 5,339,213 A | 8/1994 | O'Callaghan |
| 5,367,199 A | 11/1994 | Lefkowitz et al. |
| 5,374,787 A | 12/1994 | Miller et al. |
| 5,404,152 A | 4/1995 | Nagai |
| 5,408,621 A | 4/1995 | Ben-Arie |
| 5,414,445 A | 5/1995 | Kaneko et al. |
| 5,416,498 A | 5/1995 | Grant |
| 5,424,756 A | 6/1995 | Ho et al. |
| 5,432,531 A | 7/1995 | Calder et al. |
| 5,438,331 A | 8/1995 | Gilligan et al. |
| D362,431 S | 9/1995 | Kaneko et al. |
| 5,450,075 A | 9/1995 | Waddington |
| 5,453,761 A | 9/1995 | Tanaka |
| 5,473,343 A | 12/1995 | Kimmich et al. |
| 5,473,344 A | 12/1995 | Bacon et al. |
| 5,479,192 A | 12/1995 | Carroll, Jr. et al. |
| 5,483,261 A | 1/1996 | Yasutake |
| 5,488,204 A | 1/1996 | Mead et al. |
| 5,495,566 A | 2/1996 | Kwatinetz |
| 5,508,703 A | 4/1996 | Okamura et al. |
| 5,510,813 A | 4/1996 | Makinwa et al. |
| 5,543,588 A | 8/1996 | Bisset et al. |
| 5,555,004 A | 9/1996 | Ono et al. |
| 5,559,301 A | 9/1996 | Bryan, Jr. et al. |
| 5,559,943 A | 9/1996 | Cyr et al. |
| 5,561,445 A | 10/1996 | Miwa et al. |
| 5,564,112 A | 10/1996 | Hayes et al. |
| 5,565,887 A | 10/1996 | McCambridge et al. |
| 5,578,817 A | 11/1996 | Bidiville et al. |
| 5,581,670 A | 12/1996 | Bier et al. |
| 5,585,823 A | 12/1996 | Duchon et al. |
| 5,589,893 A | 12/1996 | Gaughan et al. |
| 5,596,347 A | 1/1997 | Robertson et al. |
| 5,598,183 A | 1/1997 | Robertson et al. |
| 5,611,040 A | 3/1997 | Brewer et al. |
| 5,611,060 A | 3/1997 | Belfiore et al. |
| 5,613,137 A | 3/1997 | Bertram et al. |
| 5,613,600 A | 3/1997 | Yokoji et al. |
| 5,617,114 A | 4/1997 | Bier et al. |
| 5,627,531 A | 5/1997 | Posso et al. |
| 5,632,679 A | 5/1997 | Tremmel |
| 5,640,258 A | 6/1997 | Kurashima et al. |
| D382,550 S | 8/1997 | Kaneko et al. |
| 5,657,012 A | 8/1997 | Tait |
| 5,661,632 A | 8/1997 | Register |
| D385,542 S | 10/1997 | Kaneko et al. |
| 5,689,285 A | 11/1997 | Asher |
| 5,726,687 A | 3/1998 | Belfiore et al. |
| 5,729,219 A | 3/1998 | Armstrong et al. |
| 5,730,165 A | 3/1998 | Philipp |
| 5,748,185 A | 5/1998 | Stephan et al. |
| 5,751,274 A | 5/1998 | Davis |
| 5,754,890 A | 5/1998 | Holmdahl et al. |
| 5,777,605 A | 7/1998 | Yoshinobu et al. |
| 5,786,818 A | 7/1998 | Brewer et al. |
| 5,790,769 A | 8/1998 | Buxton et al. |
| 5,805,144 A | 9/1998 | Scholder et al. |
| 5,808,602 A | 9/1998 | Sellers |
| 5,812,498 A | 9/1998 | Teres et al. |
| 5,825,352 A | 10/1998 | Bisset et al. |
| 5,825,353 A | 10/1998 | Will |
| 5,828,364 A | 10/1998 | Siddiqui |
| 5,835,079 A | 11/1998 | Shieh |
| 5,838,304 A | 11/1998 | Hall |
| 5,841,423 A | 11/1998 | Carroll, Jr. et al. |
| D402,281 S | 12/1998 | Ledbetter et al. |
| 5,850,213 A | 12/1998 | Imai et al. |
| 5,856,822 A | 1/1999 | Du et al. |
| 5,856,827 A | 1/1999 | Sudo |
| 5,859,629 A | 1/1999 | Tognazzini |
| 5,875,311 A | 2/1999 | Bertram et al. |
| 5,880,411 A | 3/1999 | Gillespie et al. |
| 5,883,619 A | 3/1999 | Ho et al. |
| 5,889,236 A | 3/1999 | Gillespie et al. |
| 5,889,511 A | 3/1999 | Ong et al. |
| 5,894,117 A | 4/1999 | Kamishima |
| 5,903,229 A | 5/1999 | Kishi |
| 5,907,152 A | 5/1999 | Dandiliker et al. |
| 5,907,318 A | 5/1999 | Medina |
| 5,909,211 A | 6/1999 | Combs et al. |
| 5,914,706 A | 6/1999 | Kono |
| 5,923,388 A | 7/1999 | Kurashima et al. |
| D412,940 S | 8/1999 | Kato et al. |
| 5,943,044 A | 8/1999 | Martinelli et al. |
| 5,956,019 A | 9/1999 | Bang et al. |
| 5,959,611 A | 9/1999 | Smailagic et al. |
| 5,964,661 A | 10/1999 | Dodge |
| 5,973,668 A | 10/1999 | Watanabe |
| 6,000,000 A | 12/1999 | Hawkins et al. |
| 6,002,389 A | 12/1999 | Kasser |
| 6,005,299 A | 12/1999 | Hengst |
| 6,025,832 A | 2/2000 | Sudo et al. |
| 6,031,518 A | 2/2000 | Adams et al. |
| 6,034,672 A | 3/2000 | Gaultiet et al. |
| 6,057,829 A | 5/2000 | Silfvast |
| 6,075,533 A | 6/2000 | Chang |
| 6,084,574 A | 7/2000 | Bidiville |
| D430,169 S | 8/2000 | Scibora |
| 6,097,372 A | 8/2000 | Suzuki |
| 6,122,526 A | 9/2000 | Parulski et al. |
| 6,124,587 A | 9/2000 | Bidiville et al. |
| 6,128,006 A | 10/2000 | Rosenberg et al. |
| 6,163,312 A | 12/2000 | Furuya |
| 6,166,721 A | 12/2000 | Kuroiwa et al. |
| 6,179,496 B1 | 1/2001 | Chou |
| 6,181,322 B1 | 1/2001 | Nanavati |
| D437,860 S | 2/2001 | Suzuki et al. |
| 6,188,391 B1 | 2/2001 | Seely et al. |
| 6,188,393 B1 | 2/2001 | Shu |
| 6,191,774 B1 | 2/2001 | Schena et al. |
| 6,198,054 B1 | 3/2001 | Janniere |
| 6,198,473 B1 | 3/2001 | Armstrong |
| 6,211,861 B1 | 4/2001 | Rosenberg et al. |

(56) References Cited

U.S. PATENT DOCUMENTS

| | | |
|---|---|---|
| 6,219,038 B1 | 4/2001 | Cho |
| D442,592 S | 5/2001 | Ledbetter et al. |
| 6,225,976 B1 | 5/2001 | Yates et al. |
| 6,225,980 B1 | 5/2001 | Weiss et al. |
| 6,226,534 B1 | 5/2001 | Aizawa |
| 6,227,966 B1 | 5/2001 | Yokoi |
| D443,616 S | 6/2001 | Fisher et al. |
| 6,243,078 B1 | 6/2001 | Rosenberg |
| 6,243,080 B1 | 6/2001 | Molne |
| 6,248,017 B1 | 6/2001 | Roach |
| 6,254,477 B1 | 7/2001 | Sasaki et al. |
| 6,256,011 B1 | 7/2001 | Culver |
| 6,262,717 B1 | 7/2001 | Donohue et al. |
| 6,262,785 B1 | 7/2001 | Kim |
| 6,266,050 B1 | 7/2001 | Oh et al. |
| D448,810 S | 10/2001 | Goto |
| 6,297,795 B1 | 10/2001 | Kato et al. |
| 6,310,610 B1 | 10/2001 | Beaton et al. |
| D450,713 S | 11/2001 | Masamitsu et al. |
| 6,314,483 B1 | 11/2001 | Goto et al. |
| 6,323,845 B1 | 11/2001 | Robbins |
| 6,323,846 B1 | 11/2001 | Westerman et al. |
| D452,250 S | 12/2001 | Chan |
| 6,340,800 B1 | 1/2002 | Zhai et al. |
| D454,568 S | 3/2002 | Andre et al. |
| 6,357,887 B1 | 3/2002 | Novak |
| D455,793 S | 4/2002 | Lin |
| 6,373,470 B1 | 4/2002 | Andre et al. |
| 6,377,530 B1 | 4/2002 | Burrows |
| 6,396,523 B1 | 5/2002 | Segal et al. |
| 6,424,338 B1 | 7/2002 | Anderson |
| 6,429,846 B2 | 8/2002 | Rosenberg et al. |
| 6,429,852 B1 | 8/2002 | Adams et al. |
| 6,468,630 B1 | 10/2002 | Mishima et al. |
| 6,473,069 B1 | 10/2002 | Gerphelde |
| 6,492,979 B1 | 12/2002 | Kent et al. |
| 6,496,181 B1 | 12/2002 | Bomer et al. |
| 6,497,412 B1 | 12/2002 | Bramm |
| D468,365 S | 1/2003 | Bransky et al. |
| D469,109 S | 1/2003 | Andre et al. |
| 6,504,530 B1 * | 1/2003 | Wilson et al. ............... 345/173 |
| 6,525,713 B1 | 2/2003 | Soeta et al. |
| D472,245 S | 3/2003 | Andre et al. |
| 6,587,091 B2 | 7/2003 | Serpa |
| 6,606,244 B1 | 8/2003 | Liu et al. |
| 6,636,197 B1 | 10/2003 | Goldenberg et al. |
| 6,639,584 B1 | 10/2003 | Li |
| 6,640,250 B1 | 10/2003 | Chang et al. |
| 6,650,975 B2 | 11/2003 | Ruffner |
| D483,809 S | 12/2003 | Lim |
| 6,664,951 B1 | 12/2003 | Fujii et al. |
| 6,677,927 B1 | 1/2004 | Bruck et al. |
| 6,686,904 B1 | 2/2004 | Sherman et al. |
| 6,690,387 B2 | 2/2004 | Zimmerman et al. |
| 6,703,550 B2 | 3/2004 | Chu |
| 6,724,817 B1 | 4/2004 | Simpson et al. |
| 6,727,889 B2 | 4/2004 | Shaw |
| D489,731 S | 5/2004 | Huang |
| 6,738,045 B2 | 5/2004 | Hinckley et al. |
| 6,750,803 B2 | 6/2004 | Yates et al. |
| 6,781,576 B2 | 8/2004 | Tamura |
| 6,788,288 B2 | 9/2004 | Ano |
| 6,791,533 B2 | 9/2004 | Su |
| 6,795,057 B2 | 9/2004 | Gordon |
| D497,618 S | 10/2004 | Andre et al. |
| 6,844,872 B1 | 1/2005 | Farag et al. |
| 6,886,842 B2 | 5/2005 | Vey et al. |
| 6,894,916 B2 | 5/2005 | Reohr et al. |
| D506,476 S | 6/2005 | Andre et al. |
| 6,922,189 B2 | 7/2005 | Fujiyoshi |
| 6,930,494 B2 | 8/2005 | Tesdahl et al. |
| 6,977,808 B2 | 12/2005 | Lam et al. |
| 6,978,127 B1 | 12/2005 | Bulthuis et al. |
| 7,006,077 B1 | 2/2006 | Uusimäki |
| 7,015,894 B2 | 3/2006 | Morohoshi |
| 7,046,230 B2 | 5/2006 | Zadesky et al. |
| 7,069,044 B2 | 6/2006 | Okada et al. |
| 7,084,856 B2 | 8/2006 | Huppi |
| 7,091,886 B2 | 8/2006 | Depue et al. |
| 7,113,196 B2 | 9/2006 | Kerr |
| 7,119,792 B1 | 10/2006 | Andre et al. |
| 7,184,064 B2 | 2/2007 | Zimmerman et al. |
| 7,206,038 B2 | 4/2007 | Choi et al. |
| 7,215,319 B2 | 5/2007 | Kamijo et al. |
| 7,233,318 B1 | 6/2007 | Farag et al. |
| 7,236,154 B1 | 6/2007 | Kerr et al. |
| 7,511,702 B2 | 3/2009 | Hotelling |
| 7,538,760 B2 | 5/2009 | Hotelling et al. |
| 7,652,230 B2 | 1/2010 | Baier |
| 7,663,607 B2 | 2/2010 | Hotelling et al. |
| 8,040,142 B1 * | 10/2011 | Bokma et al. ............... 324/658 |
| 8,479,122 B2 | 7/2013 | Hotelling et al. |
| 2001/0011991 A1 | 8/2001 | Wang et al. |
| 2001/0043545 A1 | 11/2001 | Aratani |
| 2001/0050673 A1 | 12/2001 | Davenport |
| 2001/0051046 A1 | 12/2001 | Watanabe et al. |
| 2002/0027547 A1 | 3/2002 | Kamijo |
| 2002/0030665 A1 | 3/2002 | Ano |
| 2002/0033848 A1 | 3/2002 | Sciammarella et al. |
| 2002/0045960 A1 | 4/2002 | Phillips et al. |
| 2002/0071550 A1 | 6/2002 | Pletikosa |
| 2002/0089545 A1 | 7/2002 | Levi Montalcini |
| 2002/0118131 A1 | 8/2002 | Yates et al. |
| 2002/0118169 A1 | 8/2002 | Hinckley et al. |
| 2002/0154090 A1 | 10/2002 | Lin |
| 2002/0158844 A1 | 10/2002 | McLoone et al. |
| 2002/0164156 A1 | 11/2002 | Bilbrey |
| 2002/0180701 A1 | 12/2002 | Hayama et al. |
| 2003/0002246 A1 | 1/2003 | Kerr |
| 2003/0025679 A1 | 2/2003 | Taylor et al. |
| 2003/0043121 A1 | 3/2003 | Chen |
| 2003/0043174 A1 | 3/2003 | Hinckley et al. |
| 2003/0050092 A1 | 3/2003 | Yun |
| 2003/0076301 A1 | 4/2003 | Tsuk et al. |
| 2003/0076303 A1 | 4/2003 | Huppi |
| 2003/0091377 A1 | 5/2003 | Hsu et al. |
| 2003/0095095 A1 | 5/2003 | Pihlaja |
| 2003/0095096 A1 | 5/2003 | Robbin et al. |
| 2003/0098851 A1 | 5/2003 | Brink |
| 2003/0184517 A1 | 10/2003 | Senzui et al. |
| 2003/0206202 A1 | 11/2003 | Moriya |
| 2004/0056845 A1 * | 3/2004 | Harkcom et al. ........... 345/173 |
| 2004/0156192 A1 | 8/2004 | Kerr et al. |
| 2004/0215986 A1 | 10/2004 | Shakkarwar |
| 2004/0224638 A1 | 11/2004 | Fadell et al. |
| 2004/0227736 A1 | 11/2004 | Kamrath et al. |
| 2004/0239622 A1 | 12/2004 | Proctor et al. |
| 2004/0252109 A1 | 12/2004 | Trent, Jr. et al. |
| 2004/0253989 A1 | 12/2004 | Tupler et al. |
| 2004/0263388 A1 | 12/2004 | Krumm et al. |
| 2004/0267874 A1 | 12/2004 | Westberg et al. |
| 2005/0030048 A1 | 2/2005 | Bolender |
| 2005/0041018 A1 | 2/2005 | Philipp |
| 2005/0052425 A1 | 3/2005 | Zadesky et al. |
| 2005/0110768 A1 | 5/2005 | Marriott et al. |
| 2005/0204309 A1 | 9/2005 | Szeto |
| 2005/0275567 A1 | 12/2005 | Depue |
| 2006/0026521 A1 | 2/2006 | Hotelling et al. |
| 2006/0097991 A1 | 5/2006 | Hotelling et al. |
| 2006/0109252 A1 | 5/2006 | Kolmykov-Zotov et al. |
| 2006/0181517 A1 | 8/2006 | Zadesky et al. |
| 2006/0197750 A1 | 9/2006 | Kerr et al. |
| 2006/0197753 A1 | 9/2006 | Hotelling |
| 2006/0244733 A1 | 11/2006 | Geaghan |
| 2006/0250377 A1 | 11/2006 | Zadesky et al. |
| 2006/0274905 A1 | 12/2006 | Lindahl et al. |
| 2006/0279548 A1 * | 12/2006 | Geaghan ..................... 345/173 |
| 2007/0013671 A1 | 1/2007 | Zadesky et al. |
| 2007/0052044 A1 | 3/2007 | Forsblad et al. |
| 2007/0052691 A1 | 3/2007 | Zadesky et al. |
| 2007/0080936 A1 | 4/2007 | Tsuk et al. |
| 2007/0080938 A1 | 4/2007 | Robbin et al. |
| 2007/0083822 A1 | 4/2007 | Robbin et al. |
| 2007/0085841 A1 | 4/2007 | Tsuk et al. |

(56) References Cited

U.S. PATENT DOCUMENTS

| | | | |
|---|---|---|---|
| 2007/0097547 A1 | 5/2007 | Yazawa et al. | |
| 2007/0119698 A1* | 5/2007 | Day | 200/510 |
| 2007/0152975 A1 | 7/2007 | Ogihara | |
| 2007/0152977 A1 | 7/2007 | Ng et al. | |
| 2007/0152983 A1 | 7/2007 | McKillop et al. | |
| 2007/0242057 A1 | 10/2007 | Zadesky et al. | |
| 2007/0268274 A1 | 11/2007 | Westerman et al. | |
| 2007/0273671 A1 | 11/2007 | Zadesky et al. | |
| 2007/0276525 A1 | 11/2007 | Zadesky et al. | |
| 2007/0279394 A1 | 12/2007 | Lampell | |
| 2008/0006453 A1 | 1/2008 | Hotelling et al. | |
| 2008/0006454 A1 | 1/2008 | Hotelling | |
| 2008/0007533 A1 | 1/2008 | Hotelling et al. | |
| 2008/0007539 A1 | 1/2008 | Hotelling et al. | |
| 2008/0012837 A1 | 1/2008 | Marriott et al. | |
| 2008/0018611 A1* | 1/2008 | Serban et al. | 345/173 |
| 2008/0018615 A1 | 1/2008 | Zadesky et al. | |
| 2008/0018616 A1 | 1/2008 | Lampell et al. | |
| 2008/0018617 A1 | 1/2008 | Ng et al. | |
| 2008/0036734 A1 | 2/2008 | Forsblad et al. | |
| 2008/0055259 A1 | 3/2008 | Plocher | |
| 2008/0087476 A1 | 4/2008 | Prest et al. | |
| 2008/0088582 A1 | 4/2008 | Prest et al. | |
| 2008/0088596 A1 | 4/2008 | Prest et al. | |
| 2008/0088597 A1 | 4/2008 | Prest et al. | |
| 2008/0088600 A1 | 4/2008 | Prest et al. | |
| 2008/0111795 A1 | 5/2008 | Bollinger | |
| 2009/0020343 A1 | 1/2009 | Rothkopf et al. | |
| 2009/0058819 A1 | 3/2009 | Gioscia et al. | |
| 2010/0079402 A1 | 4/2010 | Grunthaner | |
| 2010/0253645 A1 | 10/2010 | Bolender | |
| 2011/0115738 A1 | 5/2011 | Suzuki et al. | |
| 2013/0018489 A1 | 1/2013 | Grunthaner | |

FOREIGN PATENT DOCUMENTS

| | | |
|---|---|---|
| CN | 1499356 | 5/2004 |
| DE | 3615742 | 11/1987 |
| DE | 19722636 | 12/1998 |
| DE | 10022537 | 11/2000 |
| DE | 20019074 U1 | 2/2001 |
| DE | 10 2006 000637 | 7/2007 |
| EP | 0178157 | 4/1986 |
| EP | 0419145 | 3/1991 |
| EP | 0419145 A1 | 3/1991 |
| EP | 0498540 A2 | 8/1992 |
| EP | 0521683 A2 | 1/1993 |
| EP | 0 672 981 A1 | 9/1995 |
| EP | 0674288 A1 | 9/1995 |
| EP | 0 707 280 A2 | 4/1996 |
| EP | 0 707 280 A3 | 4/1996 |
| EP | 0 731 407 A1 | 9/1996 |
| EP | 0 744 886 A1 | 11/1996 |
| EP | 0551778 B1 | 1/1997 |
| EP | 0880091 | 11/1998 |
| EP | 1 026 713 A1 | 8/2000 |
| EP | 1081922 A2 | 3/2001 |
| EP | 1098241 A2 | 5/2001 |
| EP | 1 133 057 | 9/2001 |
| EP | 1162826 A2 | 12/2001 |
| EP | 1205836 A2 | 5/2002 |
| EP | 1251455 A2 | 10/2002 |
| EP | 1 467 392 | 10/2004 |
| EP | 1482401 A2 | 12/2004 |
| EP | 1 496 467 | 1/2005 |
| EP | 1542437 A2 | 6/2005 |
| EP | 1 589 407 | 10/2005 |
| EP | 1 659 481 A2 | 5/2006 |
| FR | 2 686 440 A1 | 7/1993 |
| GB | 2072389 | 9/1981 |
| GB | 2315186 | 1/1998 |
| GB | 2391060 | 1/2004 |
| GB | 2402105 A | 12/2004 |
| JP | 57-95722 | 6/1982 |
| JP | 57-97626 | 6/1982 |
| JP | 61-117619 | 6/1986 |
| JP | 61-124009 | 6/1986 |
| JP | 63-20411 | 1/1988 |
| JP | 63-106826 | 5/1988 |
| JP | 63-181022 | 7/1988 |
| JP | 63-298518 | 12/1988 |
| JP | 03-57617 | 6/1991 |
| JP | 3-192418 | 8/1991 |
| JP | 3192418 | 8/1991 |
| JP | 04-32920 | 2/1992 |
| JP | 5-041135 | 2/1993 |
| JP | 5-080938 | 4/1993 |
| JP | 5-101741 | 4/1993 |
| JP | 05-36623 | 5/1993 |
| JP | 5-189110 | 7/1993 |
| JP | 5-205565 | 8/1993 |
| JP | 5-211021 | 8/1993 |
| JP | 5-217464 | 8/1993 |
| JP | 05-233141 | 9/1993 |
| JP | 05-262276 | 10/1993 |
| JP | 5-265656 | 10/1993 |
| JP | 5-274956 | 10/1993 |
| JP | 05-289811 | 11/1993 |
| JP | 5-298955 | 11/1993 |
| JP | 5-325723 | 12/1993 |
| JP | 06-20570 | 1/1994 |
| JP | 6-084428 | 3/1994 |
| JP | 6-089636 | 3/1994 |
| JP | 6-96639 | 4/1994 |
| JP | 6-111695 | 4/1994 |
| JP | 6-139879 | 5/1994 |
| JP | 06-187078 | 7/1994 |
| JP | 06-208433 | 7/1994 |
| JP | 6-267382 | 9/1994 |
| JP | 06-283993 | 10/1994 |
| JP | 6-333459 | 12/1994 |
| JP | 7-107574 | 4/1995 |
| JP | 7-41882 | 7/1995 |
| JP | 7-201249 | 8/1995 |
| JP | 07-201256 | 8/1995 |
| JP | 07-253838 | 10/1995 |
| JP | 7-261899 | 10/1995 |
| JP | 7-261922 | 10/1995 |
| JP | 07-296670 | 11/1995 |
| JP | 7-319001 | 12/1995 |
| JP | 08-016292 | 1/1996 |
| JP | 8-115158 | 5/1996 |
| JP | 8-203387 | 8/1996 |
| JP | 8-293226 | 11/1996 |
| JP | 8-298045 | 11/1996 |
| JP | 08-299541 | 11/1996 |
| JP | 8-316664 | 11/1996 |
| JP | 09-044289 | 2/1997 |
| JP | 09-069023 | 3/1997 |
| JP | 09-128148 | 5/1997 |
| JP | 9-134248 | 5/1997 |
| JP | 9134248 | 5/1997 |
| JP | 9-218747 | 8/1997 |
| JP | 9-230993 | 9/1997 |
| JP | 9-231858 | 9/1997 |
| JP | 09-233161 | 9/1997 |
| JP | 9-251347 | 9/1997 |
| JP | 9-258895 | 10/1997 |
| JP | 9-288926 | 11/1997 |
| JP | 10-74127 | 3/1998 |
| JP | 10-074429 | 3/1998 |
| JP | 1074127 | 3/1998 |
| JP | 10-198507 | 7/1998 |
| JP | 10-227878 | 8/1998 |
| JP | 10-326149 | 12/1998 |
| JP | 11-184607 | 7/1999 |
| JP | 11-194863 | 7/1999 |
| JP | 11-194872 | 7/1999 |
| JP | 11-194882 | 7/1999 |
| JP | 11-194883 | 7/1999 |
| JP | 11-194891 | 7/1999 |
| JP | 11-195353 | 7/1999 |
| JP | 11-203045 | 7/1999 |
| JP | 1999-272378 | 10/1999 |

(56) References Cited

FOREIGN PATENT DOCUMENTS

| | | |
|---|---|---|
| JP | 2000-163031 A | 6/2000 |
| JP | 2000-215549 | 8/2000 |
| JP | 2000-267786 | 9/2000 |
| JP | 2000-353045 | 12/2000 |
| JP | 2001-11769 | 1/2001 |
| JP | 2001-22508 | 1/2001 |
| JP | 2002-215311 | 8/2002 |
| JP | 2002-342033 A | 11/2002 |
| JP | 2003-280807 | 10/2003 |
| JP | 2005-251218 | 9/2005 |
| JP | 2005-285140 | 10/2005 |
| JP | 2005-293606 | 10/2005 |
| JP | 2006-4453 | 1/2006 |
| JP | 2006-178962 | 7/2006 |
| JP | 3852854 | 12/2006 |
| JP | 2007-123473 | 5/2007 |
| KR | 1998-71394 | 10/1998 |
| KR | 1999-50198 | 7/1999 |
| KR | 2000-08579 | 2/2000 |
| KR | 2001-0052016 | 6/2001 |
| TW | 431607 | 4/2001 |
| TW | 00470193 | 12/2001 |
| TW | 547716 | 8/2003 |
| TW | I220491 | 8/2004 |
| WO | WO-94/17494 | 8/1994 |
| WO | WO 95/00897 A1 | 1/1995 |
| WO | WO-98/14863 | 4/1998 |
| WO | WO-99/49443 | 9/1999 |
| WO | WO-02/35460 A | 5/2002 |
| WO | WO-03/044645 A1 | 5/2003 |
| WO | WO 03/044956 | 5/2003 |
| WO | WO 03/090008 | 10/2003 |
| WO | WO 2004/040606 | 5/2004 |
| WO | WO-2005/055620 A2 | 6/2005 |
| WO | WO-2005/073634 | 8/2005 |
| WO | WO 2005/076117 | 8/2005 |
| WO | WO-2005/124526 A2 | 12/2005 |
| WO | WO 2006/037545 | 4/2006 |
| WO | WO 2006/104745 | 10/2006 |
| WO | WO-2009/012183 A2 | 1/2009 |
| WO | WO-2009/012183 A3 | 1/2009 |

OTHER PUBLICATIONS

PCT Search Report and Written Opinion for PCT/US2008/069890, mailed Jan. 29, 2009 (18 pages).
"Touchpad," Notebook PC Manual, ACER Information Co. Ltd., Feb. 16, 2005, pp. 11-12.
Bang & Olufsen Telecom a/s. (2000). "BeoCom 6000 User Guide," 53 pages.
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Letter re: Bang & Olufsen a/s by David Safran, Nixon Peabody, LLP, May 21, 2004, with BeoCom 6000 Sales Training Brochure, seven pages.
Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.
Rubine, D.H. (May 1992). "Combining Gestures and Direct Manipulation," CHI '92, pp. 659-660.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
Translation of Trekstor's Defense Statement to the District Court Mannheim of May 23, 2008; 37 pages.
"Diamond Multimedia Announces Rio PMP300 Portable MP3 Player," located at http://news.harmony-central.com/Newp/1998/Rio-PMP300.html visited on May 5, 2008, 4 pages.
"Diamond Multimedia Announces Rio PMP300 Portable MP3 Music Player," located at http://news.harmony-central.com/Newp/1998/Rio-PMP300.html visited on May 5, 2008. (4 pages).
"About Quicktip®" www.logicad3d.com/docs/qt.html, downloaded Apr. 8, 2002.
"Apple Presents iPod: Ultra-Portable MP3 Music Player Puts 1,000 Songs in Your Pocket," retreived from http://www.apple.com/pr/library/2001/oct/23ipod.html on Oct. 23, 2001.
"Apple Unveils Optical Mouse and New Pro Keyboard," Press Release, Jul. 19, 2000.
"Der Klangmeister," Connect Magazine, Aug. 1998.
"Neuros MP3 Digital Audio Computer," www.neurosaudio.com, downloaded Apr. 9, 2003.
"OEM Touchpad Modules" website www.glidepoint.com/sales/modules.index.shtml, downloaded Feb. 13, 2002.
"Product Overview—ErgoCommander®," www.logicad3d.com/products/ErgoCommander.htm, downloaded Apr. 8, 2002.
"Product Overview—SpaceMouse® Classic " www.logicad3d.com/products/Classic.htm, downloaded Apr. 8, 2002.
"Synaptics Tough Pad Interfacing Guide," Second Edition, Mar. 25, 1998, Synaptics, Inc., San Jose, CA, pp. 1-90.
"System Service and Troubleshooting Manual," www.dsplib.com/intv/Master, downloaded Dec. 11, 2002.
"Alps Electric introduces the GlidePoint Wave Keyboard; combines a gently curved design with Alps' advanced GlidePoint Technology", Business Wire, (Oct. 21, 1996).
Alps Electric Ships GlidePoint Keyboard for the Macintosh; Includes a GlidePoint Touchpad, Erase-Eaze Backspace Key and Contoured Wrist Rest, Business Wire, (Jul. 1, 1996).
"APS show guide to exhibitors", Physics Today, 49(3) (Mar. 1996).
"Design News literature plus", Design News, 51(24) (Dec. 18, 1995).
"Manufactures", Laser Focus World, Buyers Guide '96, 31(12) (Dec. 1995).
"National Design Engineering Show", Design News, 52(5) (Mar. 4, 1996).
"Preview of exhibitor booths at the Philadelphia show", Air Conditioning Heating & News, 200(2) (Jan. 13, 1997).
"Product news", Design News, 53(11) (Jun. 9, 1997).
"Product news", Design News, 53(9) (May 5, 1997).
Ahl, "Controller Update", Creative Computing vol. 9, No. 12, Dec. 1983, pp. 142-154.
Ahmad, "A Usable Real-Time 3D Hand Tracker," Proceedings of the 28th Asilomar Conference on Signals, Systems and Computers—Part 2 (of 2) vol. 2 (Oct 1994), 5 pages.
Atari VCS/2600 Peripherals, www.classicgaming.com downloaded Feb. 28, 2007, pp. 1-15.
Baig, E.C., "Your PC Just Might Need a Mouse," U.S. News & World Report 108(22) (Jun. 4, 1990).
Bang & Olufsen Telecom a/s, "BeoCom 6000 User Guide 2000."
BeoCom 6000, Sales Training Brochure, date unknown.
Bartimo, Jim, "The Portables: Traveling Quickly", Computerworld (Nov. 14, 1983).
BeoCom 6000, Sales Training Brochure, date unknown.
Bray, "Phosphors help switch on xenon," Physics in Action, pp. 1-3, Apr. 1999.
Brink et al., "Pumped-up portables", U.S. News & World Report, 116(21) (May 30, 1994).
Brown et al., "Windows on Tablets as a Means of Achieving Virtual Input Devices", Human-Computer Interaction—Interact '90 (1990).
Buxton et al., "Issues and Techniques in Touch-Sensitive Tablet Input", Computer Graphics, 19(3), Proceedings of SIGGRAPH '85 (1985).
Chapweske, Adam "PS/2 Mouse/Keyboard Protocol," 1999, http://panda.cs.ndsu.nodak.edu/~achapwes/PICmicro/PS2/ps2.htm.
Chen et al., "A Study in Interactive 3-D Rotation Using 2-D Control Devices", Computer Graphics 22(4) (Aug. 1988).
Chinese Office Action issue Dec. 29, 2006, directed to CN Application No. 200510103886.3, 25 pages.
De Meyer, Kevin, "Crystal Optical Mouse," Feb. 14, 2002, Heatseekerz, Web Article 19.
Evans et al., "Tablet-based Valuators that Provide One, Two, or Three Degrees of Freedom", Computer Graphics 15(3) (Aug. 1981).

(56) References Cited

OTHER PUBLICATIONS

Evb Elektronik "TSOP6238 IR Receiver Modules for Infrared Remote Control Systems" dated Jan. 2004 1 page.
Fiore, "Zen Touchpad," Cornell University, May 2000, 6 pages.
Gadgetboy, "Point and click with the latest mice," CNET Asia Product Review, www.asia.cnet.com/reviews . . . are/qadgetboy/0,39001770,380235900,00.htm downloaded Dec. 5, 2001.
Gfroerer, "Photoluminescence in Analysis of Surfaces and Interfaces," Encyclopedia of Analytical Chemistry, pp. 1-23, Copyright John Wiley & Sons Ltd, Chichester, 2000.
Jesitus, John , "Broken promises?", Industry Week/IW, 246(20) (Nov. 3, 1997).
Kobayashi et al. (1997) "Dynamic Soundscape: Mapping Time to Space for Audio Browsing," *Computer Human Interaction*: 16 pages.
Kobayashi et al. "Development of the Touch Switches with the Click Response," Koukuu Denshi Gihou No. 17: pp. 44-48 (Mar. 1994) (published by the Japan Aviation Electronics Industry, Ltd.); Translation of Summary.
Kobayashi (1996) "Design of Dynamic Soundscape: Mapping Time to Space for Audio Browsing with Simultaneous Listening," Thesis submitted to Program in Media Arts and Sciences at the Massachusetts Institute of Technology, (58 pages).
Letter re: Bang & Olufsen a/s by David Safran, Nixon Peabody, LLP May 21, 2004.
Luna Technologies International, Inc., LUNA Photoluminescent Safety Products, "Photoluminescence—What is Photoluminescence?" from website at http://www.lunaplast.com/photoluminescence.com on Dec. 27, 2005.
Mims, Forrest M., III, "A Few Quick Pointers; Mouses, Touch Screens, Touch Pads, Light Pads, and the Like Can Make System Easier to Use," Computers & Electronics (22) (May 1984).
Nass, Richard, "Touchpad input device goes digital to give portable systems a desktop "mouse-like" feel", Electronic Design, 44(18) (Sep. 3, 1996).
Perenson, Melissa, "New & Improved: Touchpad Redux", PC Magazine (Sep. 10, 1996).
Petersen, Marty, "Koala Pad Touch Tablet & Micro Illustrator Software," InfoWorld (Oct. 10, 1983).
Petruzzellis, "Force-Sensing Resistors" Electronics Now, 64(3), (Mar. 1993).
Photographs of Innovation 2000 Best of Show Award Presented at the 2000 Int'l CES Innovations 2000 Design & Engineering Showcase, 1 page.
Soderholm, Lars G., "Sensing Systems for 'Touch and Feel,'" Design News (May 8, 1989): pp. 72-76.
Sony presents "Choice Without Compromise" at IBC '97 M2 Presswire (Jul. 24, 1997.
Spiwak, Marc, "A Great New Wireless Keyboard", Popular Electronics, 14(12) (Dec. 1997).
Spiwak, Marc, "A Pair of Unusual Controllers", Popular Electronics 14(4) (Apr. 1997).
Sylvania, "Intellvision™ Intelligent Television Master Component Service Manual," pp. 1, 2 and 8, 1979.
Tessler, Franklin, "Point Pad", Macworld 12(10) (Oct. 1995).
Tessler, Franklin, Smart Input: How to Chose from the New Generation of Innovative Input Devices, Macworld 13(5) (May 1996).
Tessler, Franklin, "Touchpads", Macworld 13(2) (Feb. 1996).
"Triax Custom Controllers due; Video Game Controllers," HFD—The Weekly Home Furnishing Newspaper 67(1) (Jan. 4, 1993).
International Search Report and Written Opinion, dated Dec. 6, 2007, directed to related International Application No. PCT/US2007/015501.
Non-Final Office Action mailed Sep. 16, 2010, for U.S. Appl. No. 11/882,881, filed Aug. 6, 2007, nine pages.
Final Office Action mailed Feb. 4, 2011, for U.S. Appl. No. 11/882,881, filed Aug. 6, 2007, 14 pages.
Non-Final Office Action mailed Sep. 1, 2011, for U.S. Appl. No. 11/882,881, filed Aug. 6, 2007, nine pages.
Final Office Action mailed Jan. 11, 2012, for U.S. Appl. No. 11/882,881, filed Aug. 6, 2007, 15 pages.
International Search Report mailed Sep. 21, 2012, for PCT Application No. PCT/US2012/046114, filed Jul. 10, 2012, three pages.
Non-Final Office Action mailed Jul. 12, 2013, for U.S. Appl. No. 11/882,881, filed Aug. 6, 2007, 16 pages.
Final Office Action mailed Nov. 25, 2013, for U.S. Appl. No. 11/882,881, filed Aug. 6, 2007, 16 pages.
Non-Final Office Action mailed Oct. 25, 2016, for U.S. Appl. No. 11/882,881, filed Aug. 6, 2007, 37 pages.

\* cited by examiner

RESISTIVE FORCE SENSOR WITH CAPACITIVE DISCRIMINATION

FIELD OF THE DISCLOSURE

The disclosure of the present application relates to input mechanisms, and more particularly, to sensing input through the use of force and proximity sensors.

BACKGROUND

Virtually every consumer product device on the market has some form of input mechanism that allows a user to interact with the device. One of the most common input mechanisms is the button, which when pressed by a user causes the device to change a state associated with the button. The button may take many forms, from a mechanical push button, such as a rubber knob commonly found on TV remote controls and calculators, to a virtual button, such as a graphical user interface input area displayed on a flat and/or rigid touch-sensitive surface commonly found on ATMs and some handheld computing devices.

Irrespective of the form, the button is usually associated with two states—"pressed" or "not pressed". Pressing or selecting a button changes the "not pressed" state to "pressed", causing the "pressed" state to be activated. Releasing the button changes the "pressed" state back to "not pressed", causing the "pressed" state to be deactivated. In this sense, the button allows a user to define the state of input into the device.

For example, when a device is powered off and a user presses the power button, the button press activates the power button's "pressed" state, which triggers the device to power on. When the user releases the button, the button release deactivates the "pressed" state, usually to no effect. In a different example, when a user presses a horn on a car (which can be considered a large button), the horn press activates the horn's "pressed" state, triggering the car to sound the horn. When the user releases the horn, the horn release deactivates the "pressed" state, triggering the car to stop sounding the horn.

The mechanism behind the operation of many buttons is a force sensor. When a user presses a button, a force sensor detects the force being applied to the button from the user's finger, hand or other object. When the output of the sensor indicates that the force exceeds a threshold amount (e.g., a strong enough press of the user's finger to indicate the user is intending to press the button), the "pressed" state of the button is activated, triggering an action to be taken by the device due to the button being pressed.

Thus, in order for the button to work properly, it is important that the button's sensor output be interpreted correctly to indicate that the button has been pressed or released. An incorrect interpretation of the button's sensor output can result in a phantom button press or release, which can trigger an unintended action with potentially damaging consequences.

SUMMARY

In order to correctly interpret whether a user is pressing a button of a device, methods of the present disclosure can detect both the force applied to the button area as well as the proximity of a user's finger to the button area.

In this manner, proximity detection can be used to verify that a detected force is actually caused by an intended press of a button and not some other effect, such as temperature change or a stuck button, for example.

For instance, when in certain situations a temperature change causes a force sensor to indicate a force being applied to a button, the combination of proximity detection with force detection can prevent the temperature change from being confused for a user's button press if the proximity sensor indicates that no finger is in the button area.

Similarly, when in certain situations a stuck button causes a force sensor to indicate a force being applied to a button, the combination of proximity detection with force detection can prevent the stuck button from being confused for a user continuing to hold down a button if the proximity sensor indicates that the user's finger has left the button area.

In addition to resolving these signal conditioning issues, the present disclosure teaches that the same physical sensor can be utilized to switch back and forth between force detection and proximity detection, since the same sensor element can be directed to detect both resistance (to indicate applied force) and capacitance (to indicate proximity of a user's finger).

The use of a single sensor device to accomplish both force and proximity sensing can be advantageous from an implementation and a cost standpoint. From an implementation standpoint, it can be beneficial to have dual-sensing ability in one physical sensor because it ensures that the same input area can be detected for force and proximity. From a cost standpoint, it is less expensive to use one physical sensor for detecting both force and proximity, rather than two sensors whereby one is used for detecting only force and the other for detecting only proximity.

Further, the present disclosure teaches the ability of a device to programmatically change threshold amounts of the force and/or proximity output required in order to activate an input state of a button. For example, if the device can alter the level of force required to activate a button's "pressed" state, and/or the level of proximity of a finger to the button area to activate the button's "pressed" state, the effective size of the button area can be changed without changing the physical sensor associated with the button.

Such an ability could allow a user to resize a virtual button displayed on a device surface by merely adjusting the sensor threshold parameters via software control.

DETAILED DESCRIPTION

The present disclosure teaches the use of resistive force detection in combination with capacitive proximity detection in order to implement a button, for example. The resistive force detection and capacitive proximity detection may work through a rigid cover or housing, including glass, for example. The same physical sensor element may be used for both resistive force detection and capacitive proximity detection.

The resistive force sensor can be used to detect force applied by a user's finger to an input area of a device. To address situations in which the force sensor output changes due to unintended effects, such as, for example, temperature changes, a stuck button or even a user applying force to the device but not directly over the force sensor area, the capacitive proximity sensor can be used to detect the proximity of the user's finger to the input area in order to confirm the finger press.

Temperature change and sticking buttons relate to signal conditioning issues referred to as baseline drift and hysteresis, respectively. These issues make it difficult to properly interpret the sensor's output signal as clearly indicating either the "pressed" or "not pressed" state.

Baseline drift occurs when factors other than a user pressing a button, such as changes in temperature, cause the sensor to output a signal indicating that a user pressed the button. In this situation, the simple act of placing a cell phone or portable music player in the sun or near a hot appliance could cause the sensor's output to indicate that a button has been pressed.

Hysteresis occurs when a button "sticks", or fails to return completely to its original position, after being pressed. In this situation, because the "stuck" button is still exerting a force on the sensor, the sensor output may incorrectly indicate that the user is continuing to press the button.

Figure 14A:
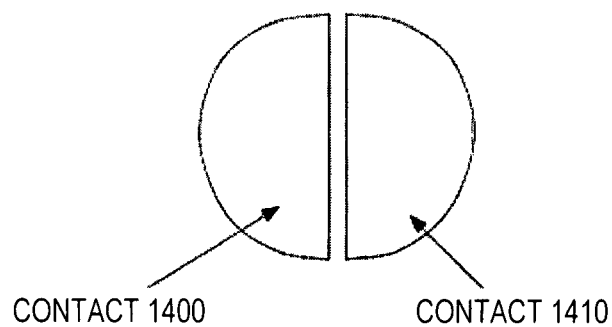
FIGS. 14a and 14b are diagrams of examples of sensor contact configurations.
Figure 14B:
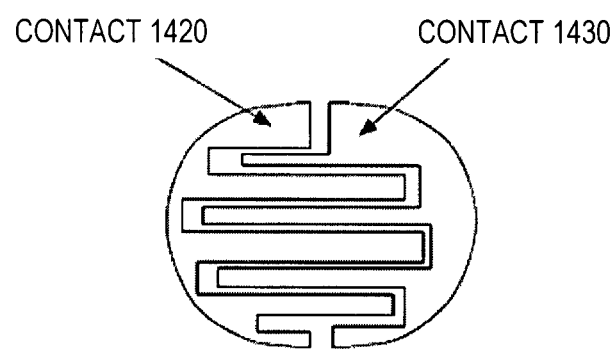

In an effort to better illustrate these issues, a basic description of the workings of a force sensor is warranted. In a basic sense, a force sensor usually works by detecting the resistance of a sensor element, and outputting a signal indicating the level of the detected resistance. A sensor element usually includes two contacts positioned closely together—but not touching—while at rest, as shown in FIGS. 14a and 14b for example. When a force is applied to the contacts, they are pushed closer together causing the contact resistance between them to be reduced. As a force being applied to the sensor element increases, the resistance between the contacts decreases.

Thus, when a force sensor detects a drop in resistance of the sensor element, the drop is interpreted as a force being applied to the sensor. The greater the drop in resistance, the greater the level of force interpreted as being applied to the sensor.

In order to detect a drop in resistance, a baseline resistance is usually established from which to measure any subsequent drop. The baseline resistance is the level of resistance detected in the sensor element when at rest—i.e., when no intended force is being applied to the sensor.

Figure 1:
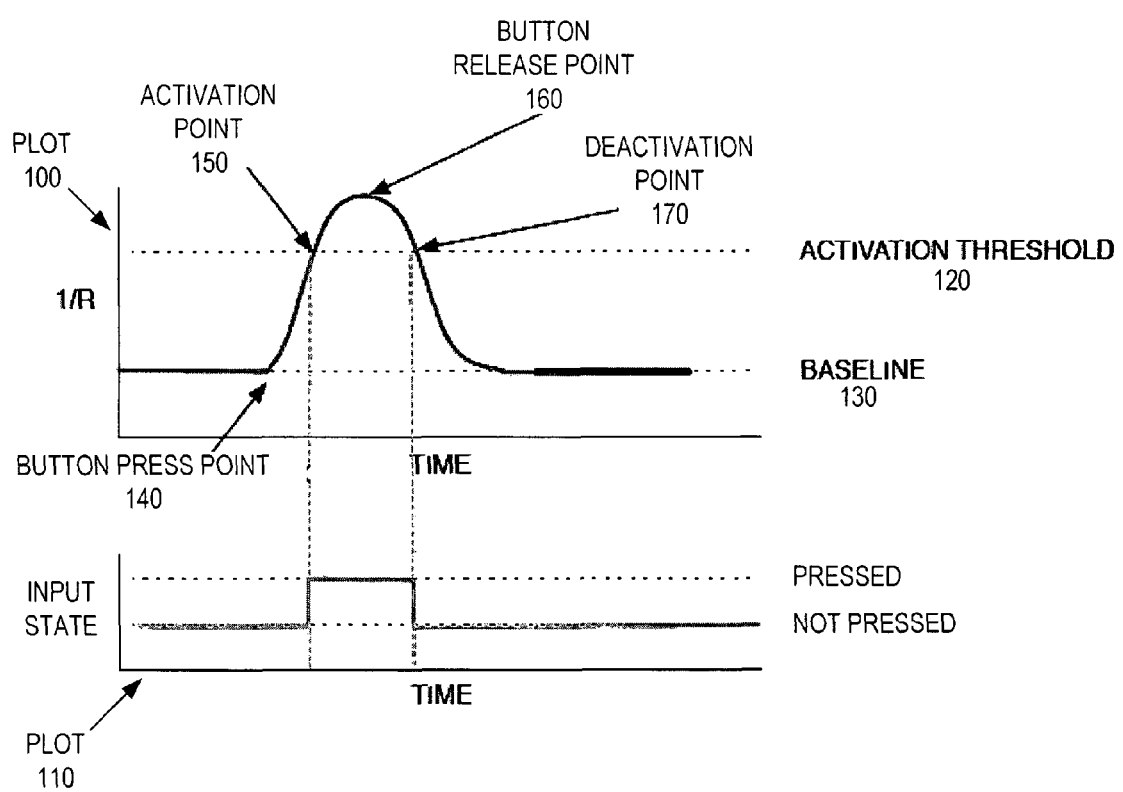
FIG. 1 is a graph of an example of idealized force sensor output and corresponding button input state.

To illustrate these issues graphically, FIG. 1 shows an example of ideal force sensor output that is not affected by baseline drift or hysteresis as a user presses and releases a button.

Although a force sensor output indicates a level of resistance, force sensor output plot 100 plots the sensor output in terms of conductance over time for better presentation purposes. Conductance is the inverse of resistance (depicted as 1/R), and enables the resistance output to be plotted with an increasing, rather than a decreasing, slope in relation to an increasing force being applied to the sensor (and vice-versa).

In an ideal situation, plot 100 shows that the force sensor only provides an output above baseline 130 when the user is pressing the button beginning at point 140. When the user releases the user's finger from the button at point 160, the output returns to baseline 130. In such a situation, a simple threshold algorithm can be utilized to interpret the button press—when the output exceeds a threshold amount of resistance, the button is considered pressed; when the output falls below the threshold amount, the button is considered released.

As shown in plot 100, the "pressed" state of the button is activated at point 150, which is when the force of the finger press exceeds the threshold amount of resistance depicted by activation threshold 120. When the output falls below activation threshold 120 at point 170, the "pressed" state of the button is deactivated, indicating that the button has been released by the user. In a real application, the output is never this clean.

Figure 2:
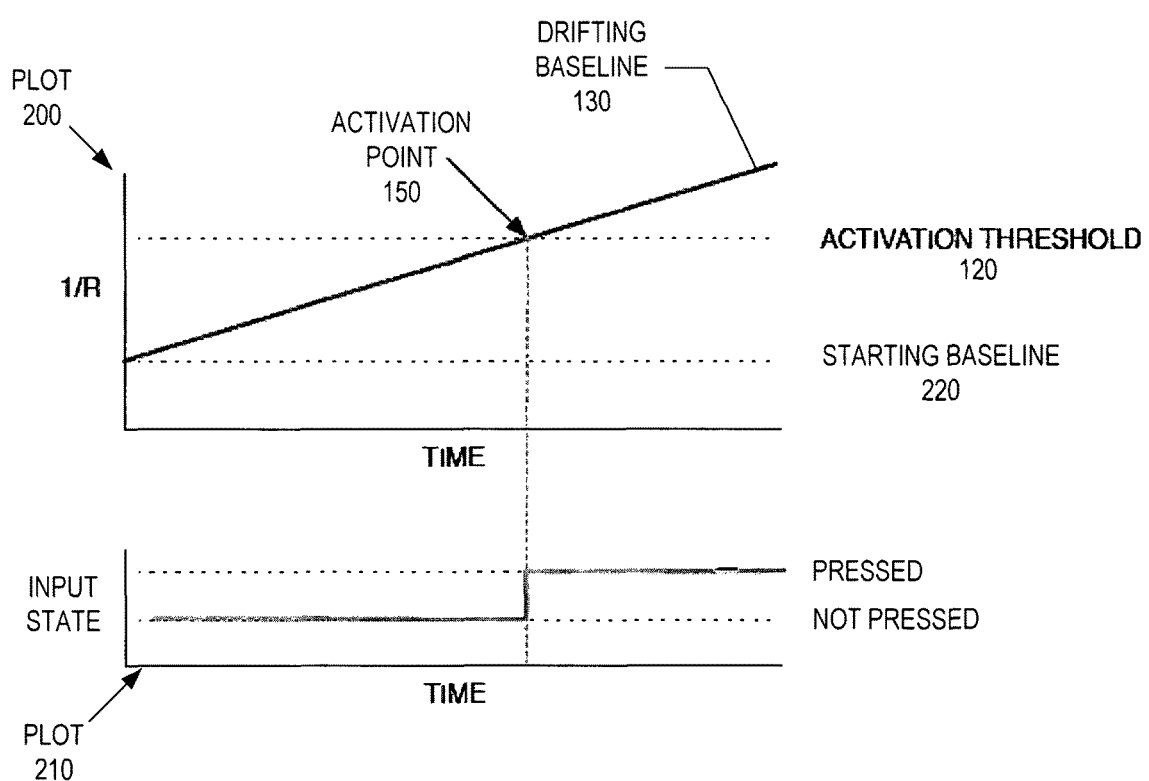
FIG. 2 is a graph of an example of force sensor output with a drifting baseline and corresponding button input state.

FIG. 2 shows an example of force sensor output that is affected by baseline drift. In this example the user does not press the button, so the sensor output should be considered at baseline at every point. In plot 200, other factors such as temperature change cause the output to drift, leading to drifting baseline 130.

Once the output (and hence drifting baseline 130) drifts from starting baseline 220 and exceeds activation threshold 120 at point 150, the "pressed" state of the button is activated. As shown in plot 210, the output is interpreted as if a user is continuing to press the button after point 150.

Thus, the simple threshold algorithm is impractical to implement in a baseline drift situation.

Figure 3:
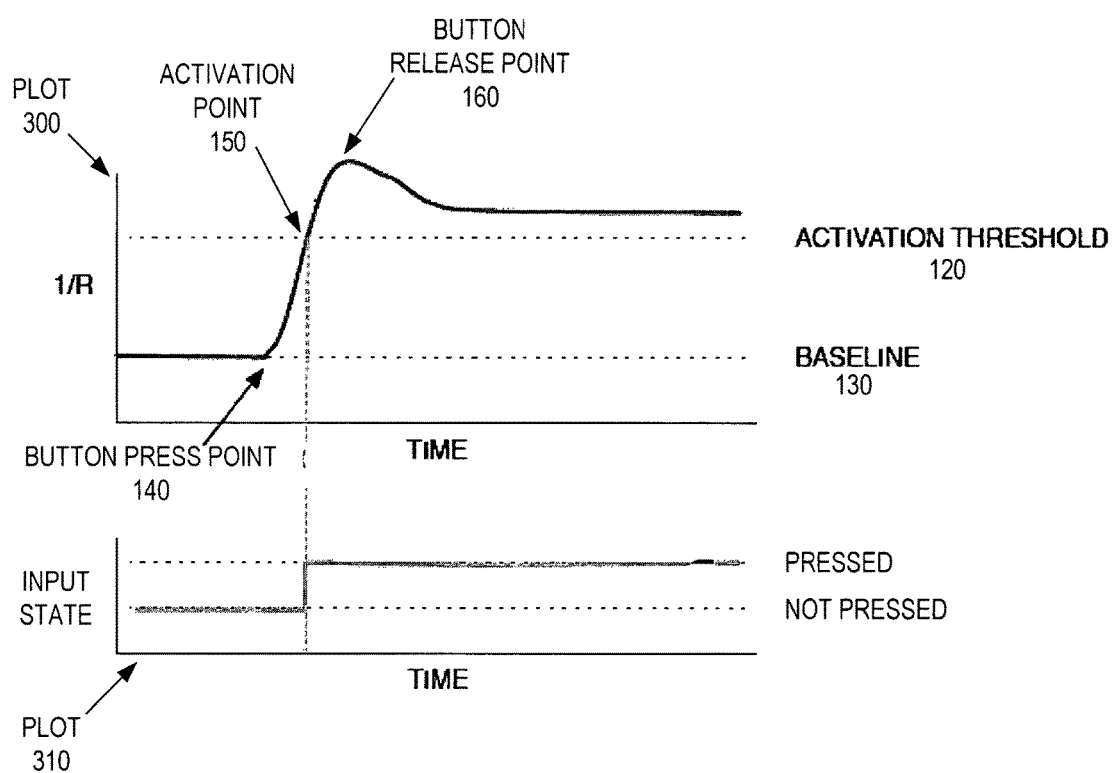
FIG. 3 is a graph of an example of force sensor output subject to hysteresis and corresponding button input state.

FIG. 3 shows an example of a force sensor output that is affected by hysteresis. In plot 300, the sensor output is correctly interpreted as the button being pressed when it exceeds activation point 150. However, when the user releases the button at point 160, the button becomes partially stuck and continues to exert a force on the sensor element, leading to a new baseline above activation threshold 120.

In this situation under the simple threshold algorithm, because the output did not fall back below activation threshold 120, the "pressed" state remains activated as illustrated in corresponding plot 310.

Thus, the simple threshold algorithm is also impractical to implement in a hysteresis situation.

Although some algorithms more complex than the simple threshold algorithm, such as a re-baseline algorithm and derivative algorithm, may attempt to interpret force sensor output properly for switch-like operation in light of baseline drift and hysteresis, each possesses drawbacks that hinder their ability to appropriately compensate for these signal conditioning issues.

The re-baseline algorithm adjusts the baseline (or "re-baselines") to match the current output level at a specified time interval. Unfortunately, this algorithm depends on picking the correct time interval at which to re-baseline. If the algorithm re-baselines too quickly, it will miss button pushes because it will re-baseline to the force applied by the user's finger. If it re-baselines too slowly, it will allow accidental button pushes because it will not catch the baseline drift in time. In some cases, there is no appropriate "happy medium" interval.

The derivative algorithm relies on the derivative of the sensor output. In other words, it looks not at the change in output at discrete intervals in time (as in the re-baseline algorithm), but rather at how quickly the output changes over a short period of time. It therefore requires the user to press quickly on the button in order for the force to be interpreted as a button press. If the user presses slowly by holding a finger over the button and gradually applying force, the button push could be missed all together.

Accordingly, the use of resistive force detection in combination with capacitive proximity detection can overcome these signal conditioning issues when implementing a button, for example.

Figure 4:
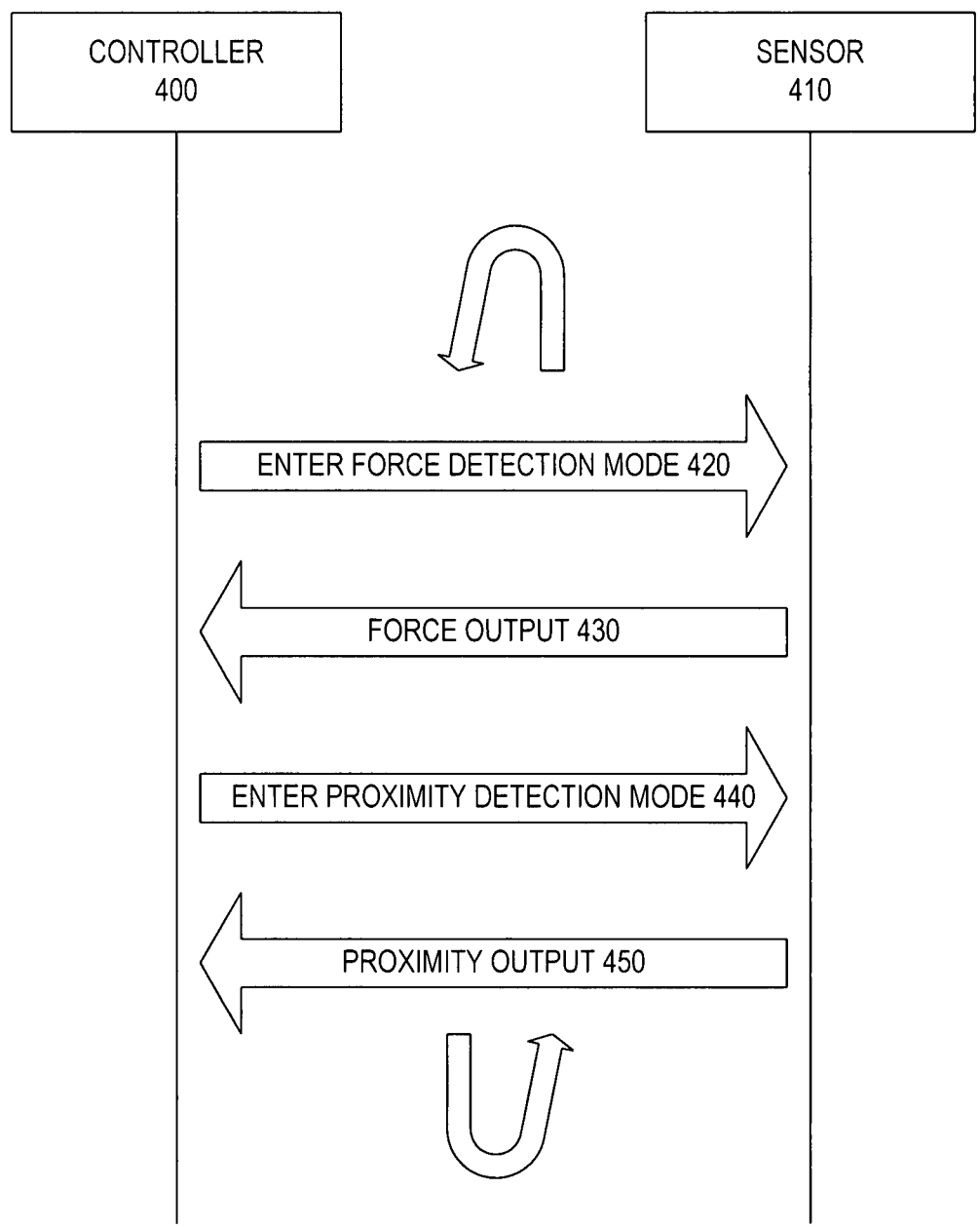
FIG. 4 is a diagram of an example of switching sensor operation modes.

FIG. 4 shows an example of a controller that can switch the operation of a sensor between two distinct operation modes—a force detection mode for providing output responsive to a force applied by an object, and a proximity detection mode for providing output responsive to a proximity of the object.

In step 420, controller 400 can switch sensor 410 into force detection mode by directing sensor 410 to detect resistance between its sensor contacts. While in force detection mode in step 430, sensor 410 can output a signal indicating the level of detected resistance which may be interpreted by controller 400 as a level of force being applied to sensor 410. In step 440, controller 400 can switch sensor 410 into proximity detection mode by directing sensor 410 to detect capacitance of the sensor element instead of resistance. While in proximity detection mode in step 450, sensor 410 can output a signal indicating the level of detected capacitance which may be interpreted by controller 400 as a level of proximity of an object to sensor 410. As indicated by the bent arrows, switching between the two sensor operation modes may occur in an alternating fashion.

Controller 400 can switch back and forth between detection modes using, for example, a copper pattern shape as a force sensor element for part of the time and as a capacitive sensor element for part of the time. Controller 400 can be programmed or instructed to direct sensor 410 to alternate between resistive force detection and capacitive proximity detection every 25 milliseconds or less, for example, so that a time lag would not be evident to a user between pressing the button and the device identifying the press as a button press (i.e., activating the "pressed" state of the button).

In an another method of the present disclosure, at specified intervals controller 400 may receive only resistive force detection output from one sensor and only capacitive proximity detection output from a different sensor situated in close proximity to the first sensor.

Figure 5:
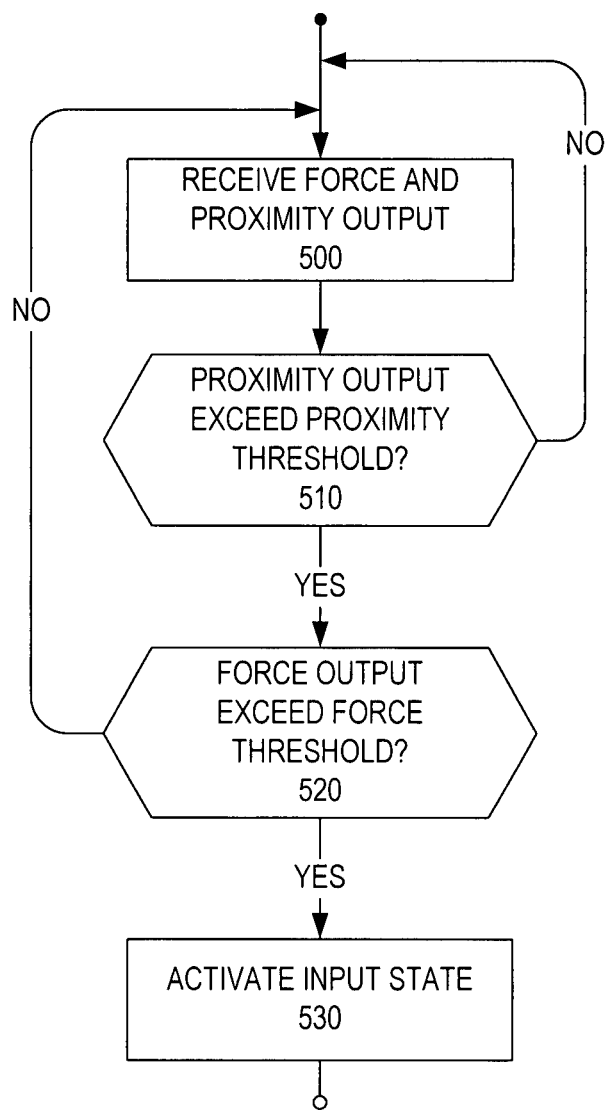
FIG. 5 is a flow chart of an example of an algorithm for activating a button input state.

FIG. 5 depicts an example of an algorithm for activating a button input state. In this example, at step 500 a processor (such as controller 400) may recurringly receive force and proximity output from one or more sensors corresponding to an input area of a housing. At step 510 the processor can determine whether the proximity output exceeds a threshold amount of proximity, and at step 520, whether the force output exceeds a threshold amount of force. If the processor determines that the threshold amounts of force and proximity have been exceeded, at step 530 the processor may activate a "pressed" input state indicating a button press on the input area of the housing.

Figure 6:
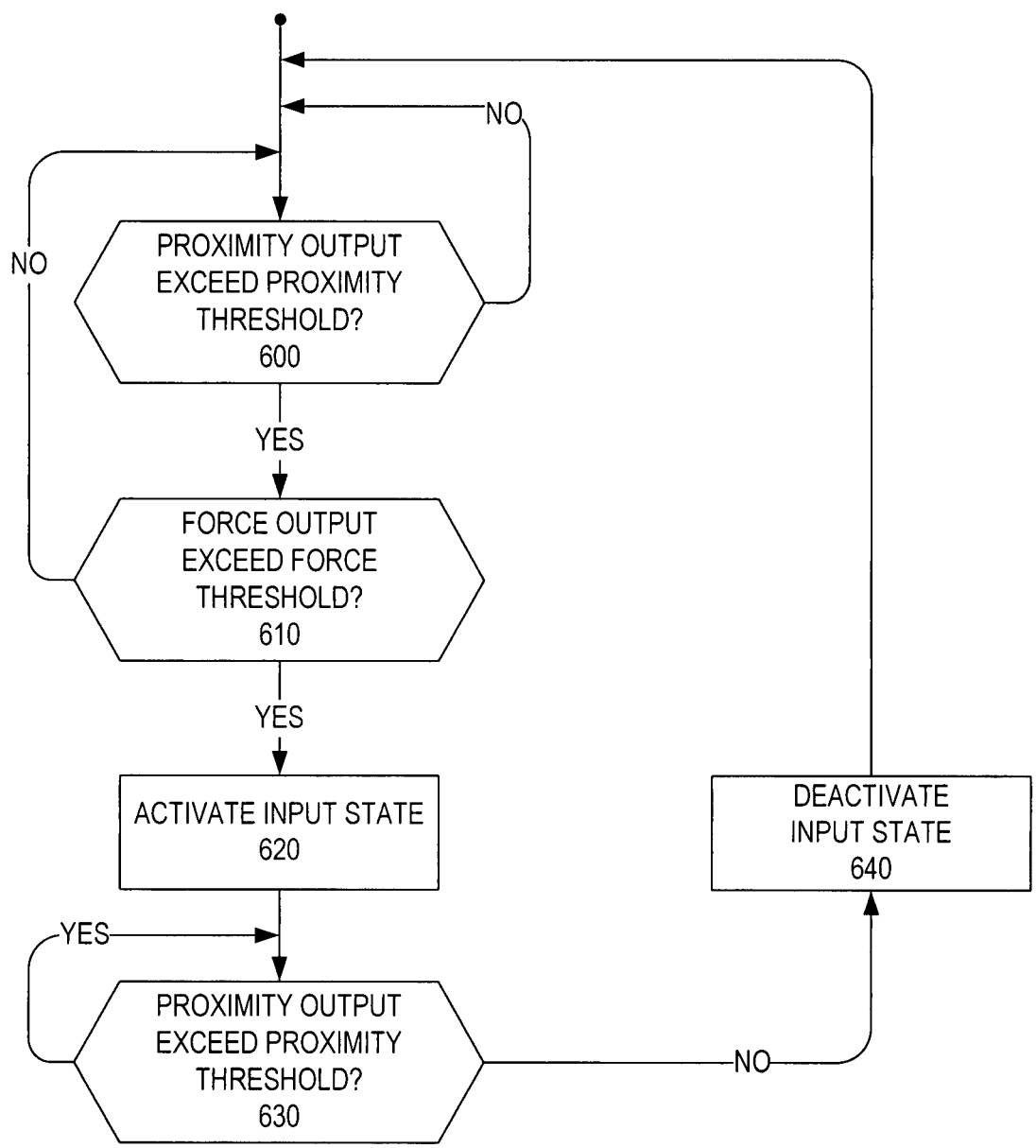
FIG. 6 is a flow chart of an example of an algorithm utilizing proximity detection for deactivating a button input state.

FIG. 6 depicts an example of an algorithm utilizing proximity detection for deactivating a button input state. In this example, a processor can determine whether the proximity output exceeds a threshold amount of proximity at step 600, and whether the force output exceeds a threshold amount of force at step 610, in order to activate the "pressed" input state at step 620. Once the state has been activated, it may remain activated until the proximity output falls below the threshold amount of proximity at step 630, at which time the processor can deactivate the "pressed" state at step 640, indicating user release of the button. This can be advantageous in situations in which a user removes a finger from the input area but the button continues to apply a force due to sticking, for example.

Figure 7:
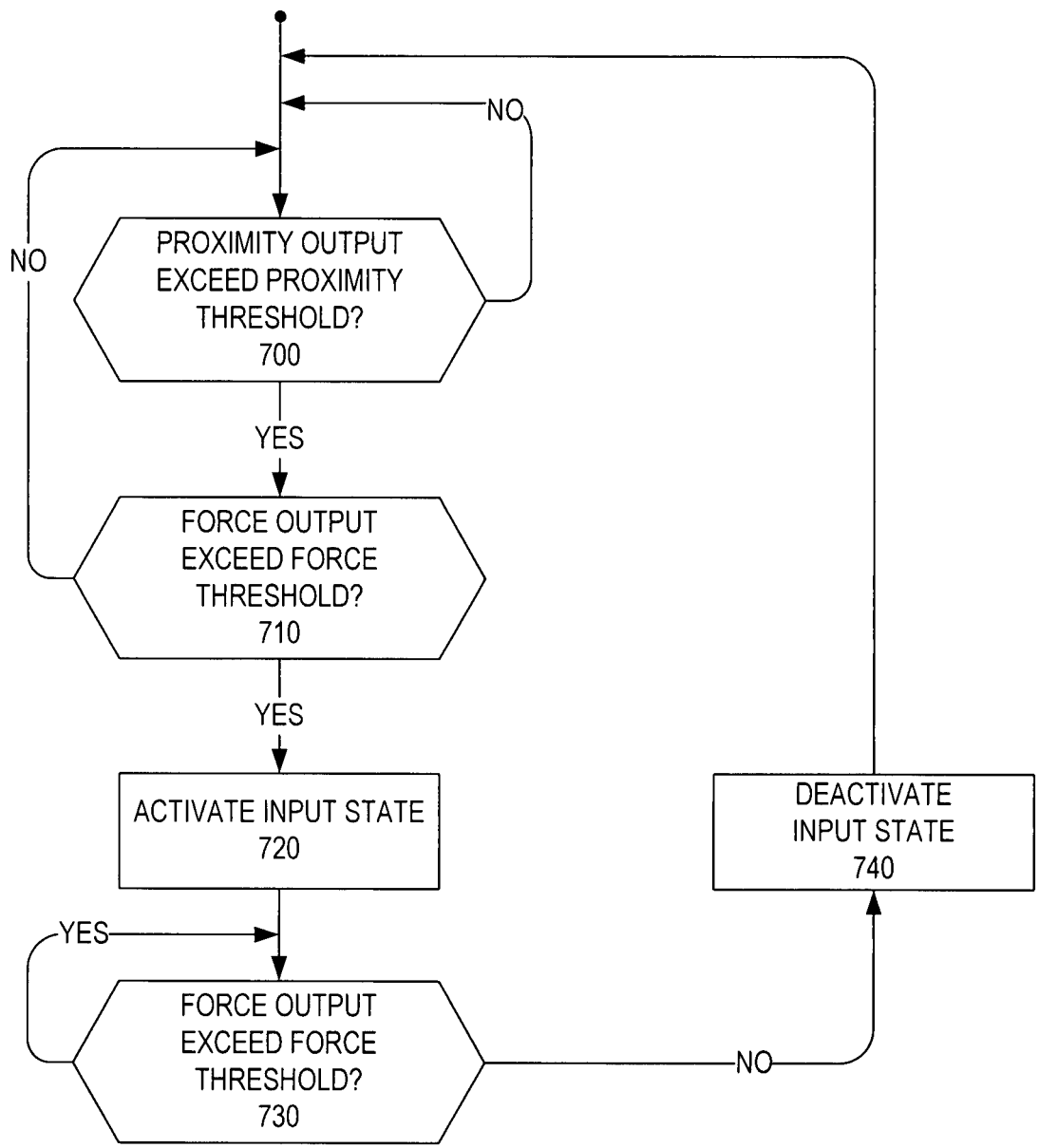
FIG. 7 is a flow chart of an example of an algorithm utilizing force detection for deactivating a button input state.

FIG. 7 depicts an example of an algorithm utilizing force detection for deactivating a button input state. In this example, a processor can determine whether the proximity output exceeds a threshold amount of proximity at step 700, and whether the force output exceeds a threshold amount of force at step 710, in order to activate the "pressed" input state at step 720. Once the state has been activated, it may remain activated until the force output falls below the threshold amount of force at step 730, at which time the processor can deactivate the "pressed" state at step 740. This can be advantageous in situations in which it is less likely that a button will stick, and more likely that a user would intend to release a button by lightening up on the force applied to the button without moving away from the button, for example.

Figure 8:
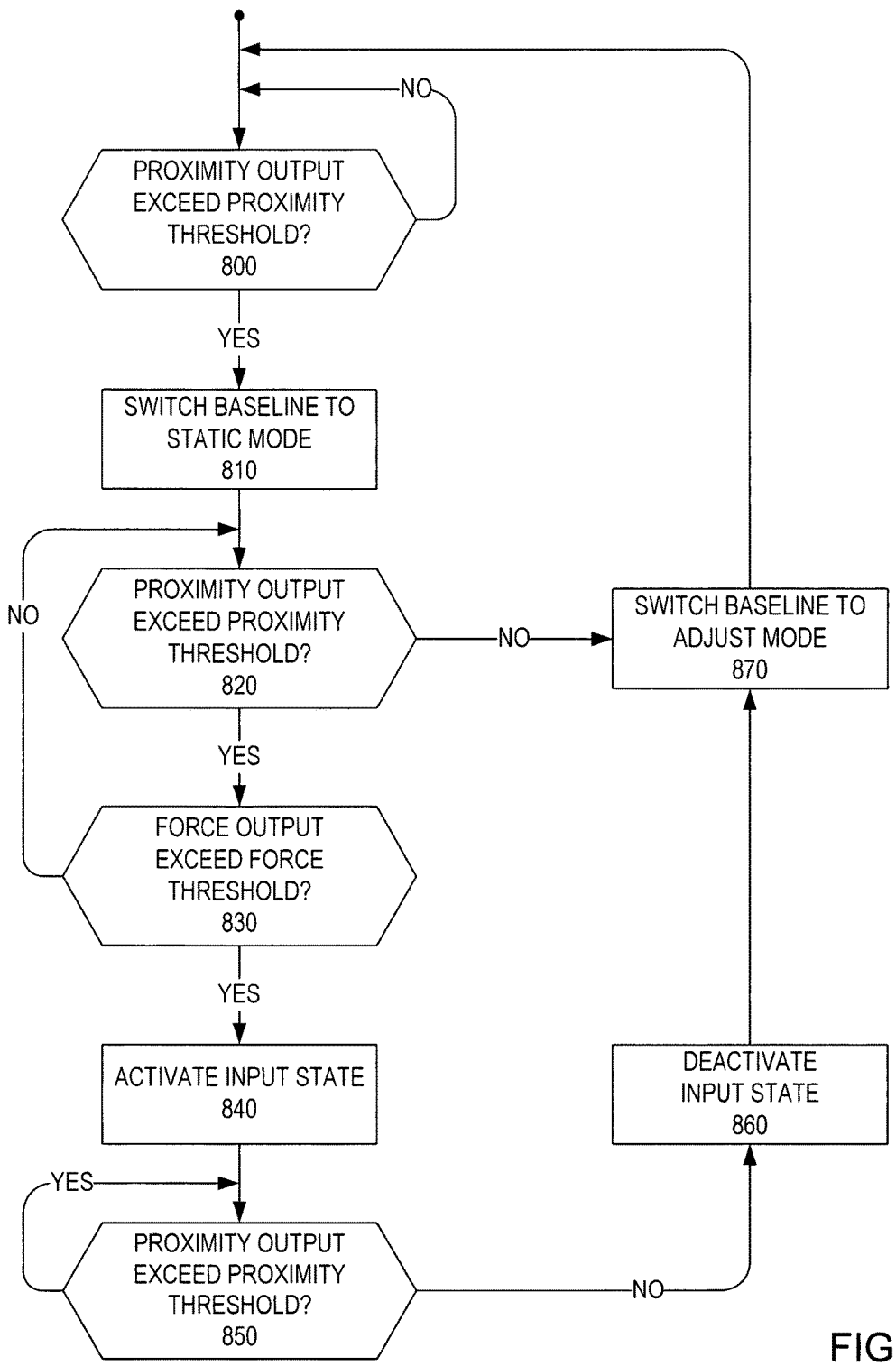
FIG. 8 is a flow chart of an example of an algorithm that accounts for baseline drift and hysteresis.
Figure 9:
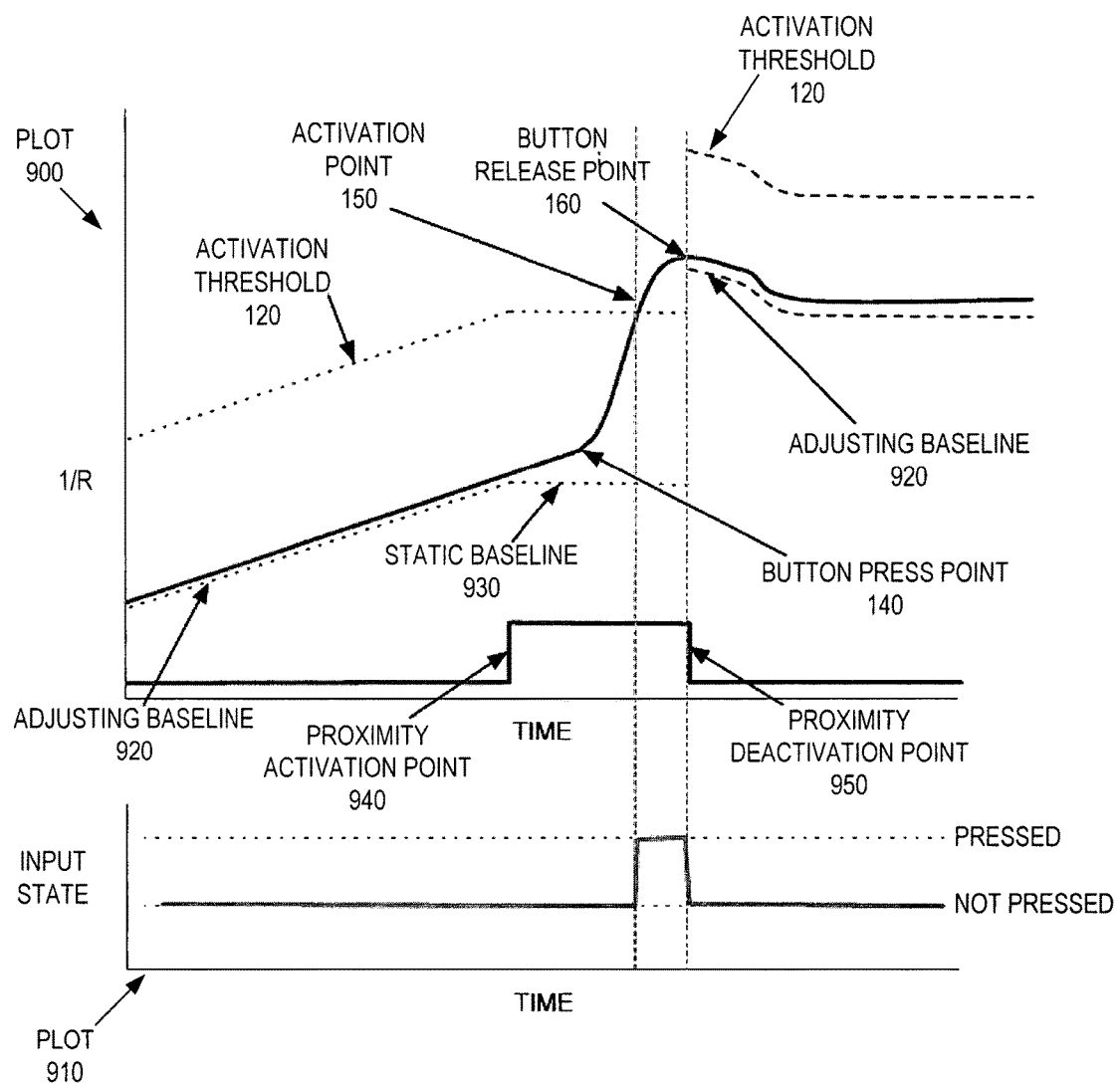
FIG. 9 is a graph of an example of force sensor output and corresponding button input state that accounts for baseline drift and hysteresis.

FIG. 8, in combination with plot 900 of FIG. 9, depicts an example of an algorithm that accounts for baseline drift and hysteresis. In this example, a processor can continually or intermittently adjust force output baseline 920 to match detected force output levels when a user's body part, such as a finger, is not near the sensor area.

At step 800 the processor can determine if the proximity output exceeds a threshold amount of proximity, indicating proximity of a finger to the sensor area. When the threshold amount of proximity is exceeded at point 940, the processor can disable the adjusting baseline functionality by switching to static baseline 930 mode at step 810. At this point, the processor can continue to determine, without adjusting for baseline drift, whether the proximity and force output exceed the threshold amounts of proximity and force, respectively, at steps 820 and 830, in order to activate the "pressed" button state at step 840.

If the proximity output falls below the threshold amount of proximity (e.g., indicating the finger moved away) at step 820, which occurs prior to the "pressed" state being activated, the processor can simply switch back to adjusting baseline 920 mode at step 870. If the proximity output falls below the threshold amount of proximity at step 850 and points 160 and 950, which occur after the "pressed" state has been activated, the processor can deactivate the "pressed" state at step 860 and switch back to adjusting baseline 920 mode at step 870. As plot 910 illustrates, the button state is correctly activated and deactivated in light of the baseline drift and hysteresis factors.

Of course, in step 850 force output could be utilized instead of proximity output to determine whether to deactivate the switch, similar to step 730, or a combination of both a force output and proximity output may be utilized, for example.

Figure 10:
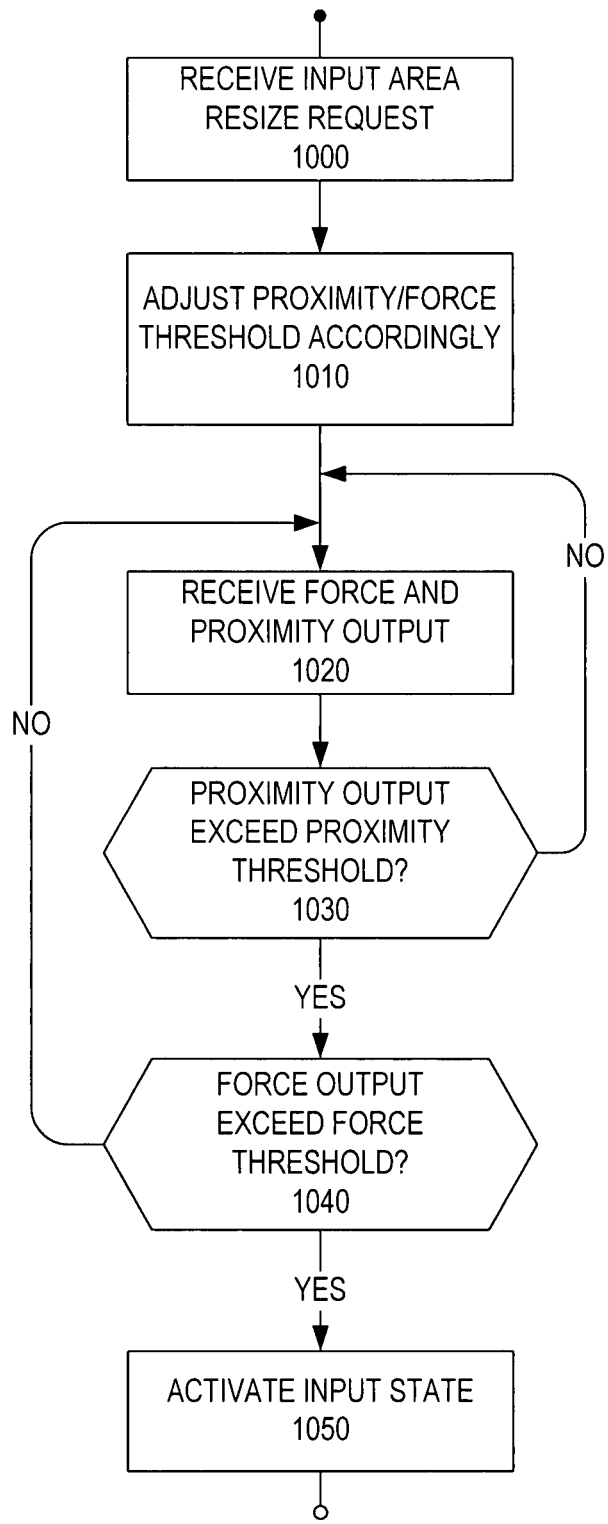
FIG. 10 is a flow chart of an example of a button resizing and input state activation algorithm.

FIG. 10 depicts an example of a button resizing and input state activation algorithm. In this example, as above, a processor can receive force and proximity sensor output at step 1020 to determine whether the threshold amounts have been exceeded at steps 1030 and 1040 for activating the "pressed" button state at step 1050. However, in this example, the processor may also receive at step 1000 a request to resize the button input area to be pressed by a user in order to activate the "pressed" button state.

This request could be generated by a user via a user interface associated with the device. Upon receiving the request, at step 1010 the processor may adjust the force and/or proximity thresholds accordingly in order to change the physical detection coverage for a virtual button displayed on an input area of the device.

Figure 11:
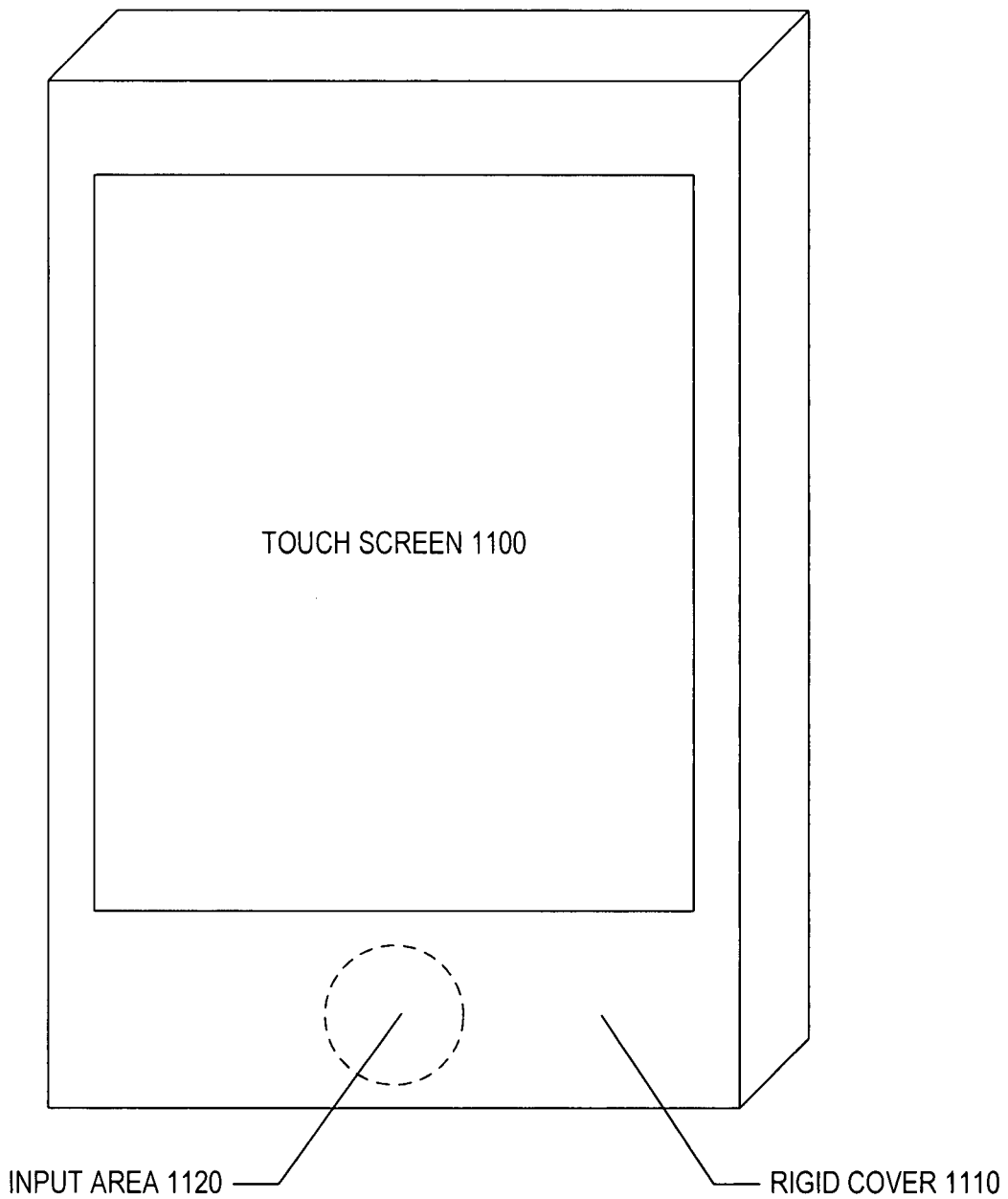
FIG. 11 is a diagram of an example of a housing.

FIG. 11 depicts an example of a housing. In this example, the housing may comprise a device including touch screen display area 1100, cover 1110 fabricated from a rigid material such as glass, for example, and input area 1120 where a user may press in order to activate a "pressed" state of a virtual button. Examples of the housing may include portable music players, mobile communications devices and other handheld computing devices.

Figure 12:
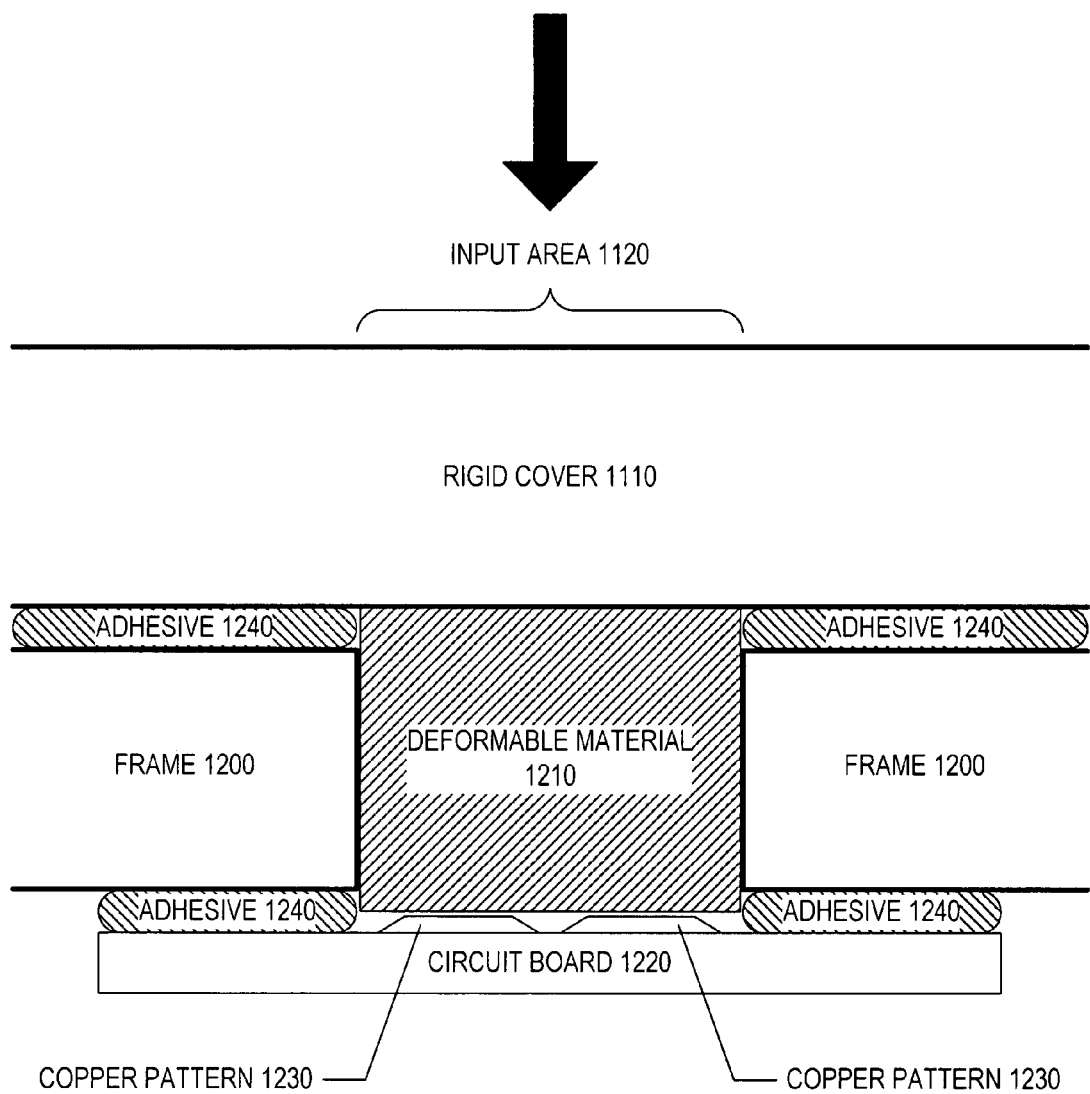
FIG. 12 is a diagram of an example of a sensor configuration.

FIG. 12 depicts an example of a sensor configuration. In this example, a hybrid force/proximity sensor may include deformable material 1210, such as, for example, rubber that is doped with carbon to make the rubber slightly conductive (although somewhat less conductive than a piece of metal is an embodiment). Pattern 1230 on printed circuit board ("PCB") 1220 may be disposed underneath rubber element 1210. FIGS. 14a and 14b depicts exemplary pattern configurations.

If rubber 1210 is compressed onto PCB 1220 pattern 1230, then the contact resistance between the two halves of the pattern can be reduced. The change in resistance caused by this force may be measured by, for example, a processor. Adhesive 1240 may be included to allow doped rubber 1210 to actually push harder on PCB 1220 pattern 1230, with adhesive 1240 compressing slightly when the user pushes their finger directly on the input area 1120 of the cover 1110.

Cover 1110 may be adhered to frame 1200, which has a small hole. PCB 1220 may be stuck to the bottom of frame 1200 and have pattern 1230 on it.

Figure 13:
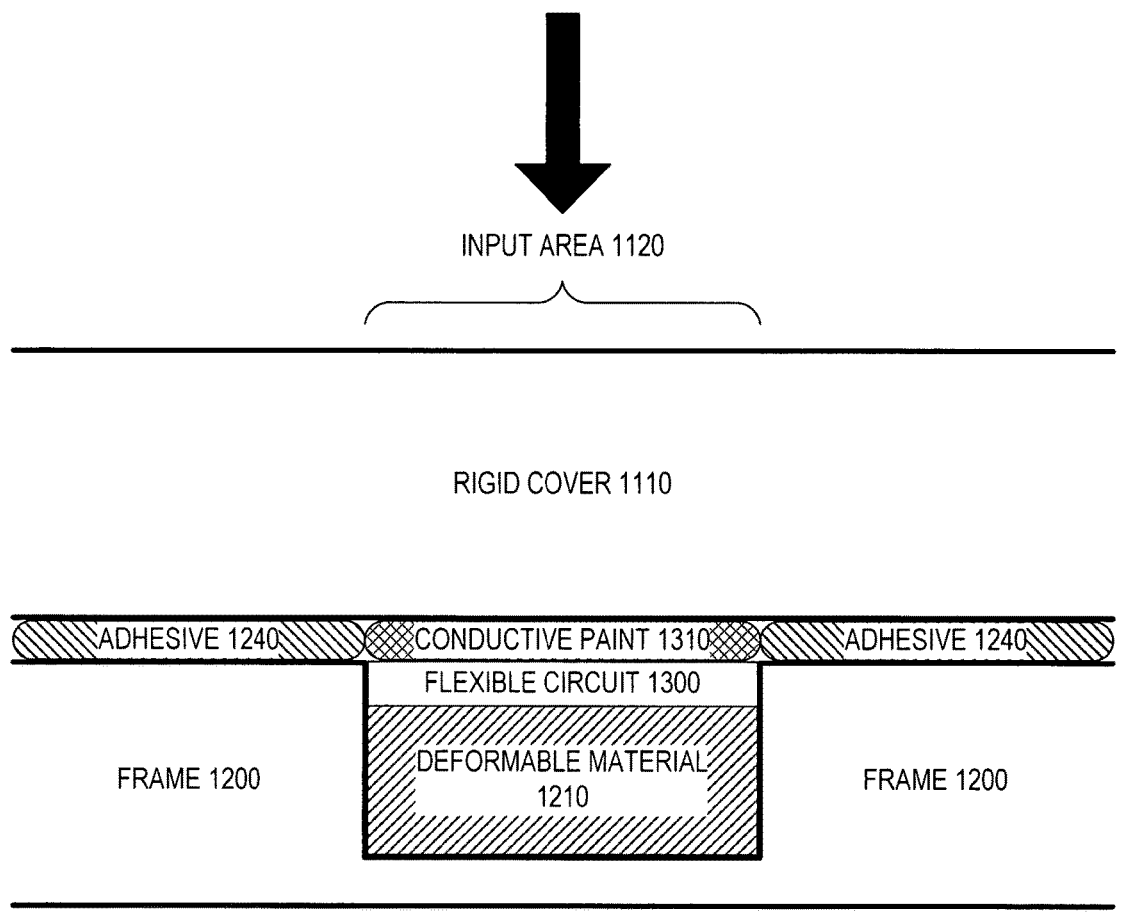
FIG. 13 is a diagram of another example of a sensor configuration.

FIG. 13 depicts an example of a sensor configuration without the hole in the frame. This example is similar to that of FIG. 12, except instead of having a hole drilled all the way through frame 1200, a small indentation may be carved out of frame 1200 in which the circuit 1300 (which may be flexible) and deformable material 1210 may be inserted. Conductive paint 1310 may be applied between cover 1110 and circuit 1300.

Figure 15:
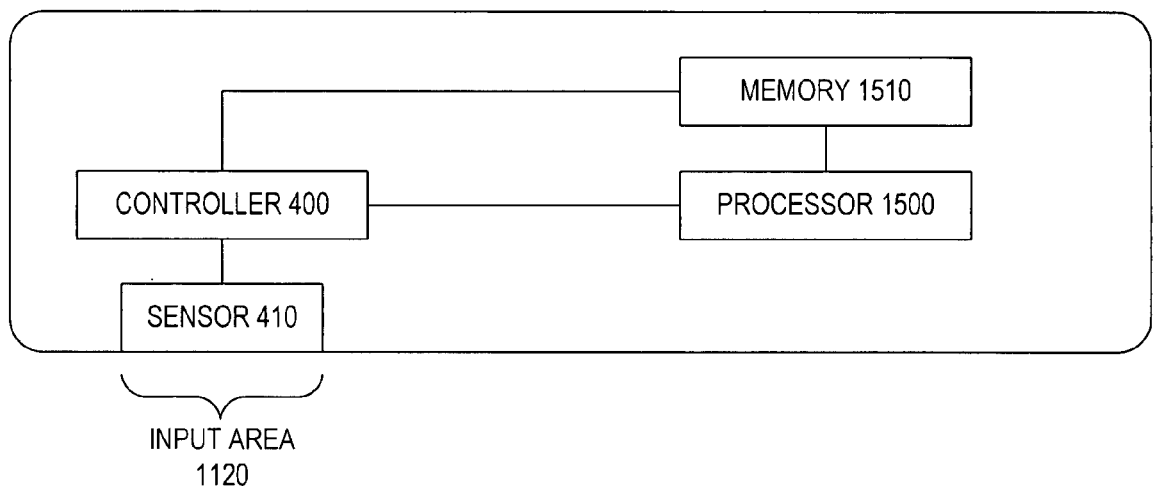
FIG. 15 is a diagram of an example of a device.

FIG. 15 depicts an example of a device. In this example, the device may include processor 1500, memory 1510, controller 400 and sensor 410.

Controller 400 may provide the necessary drive and detection circuitry to obtain force and proximity output from sensor 410. Controller 400 can process the received force and proximity output to determine whether input area 1120 was pressed or released by a user with the intent to activate or deactivate the "pressed" state of a button. In order to activate or deactivate the "pressed" state, controller 400 can send a signal indicating such activation or deactivation to processor 1500 (e.g., a central processor responsible for running the device), which may trigger the appropriate programming functionality to react to the indicated button press or release.

Memory 1510 may include, for example, one or more of the following types of storage media: magnetic disks; optical media; and semiconductor memory devices such as static and dynamic random access memory (RAM), Electrically Programmable Read-Only Memory ("EPROM"), Electrically Erasable Programmable Read-Only Memory ("EEPROM"), Programmable Gate Arrays and flash devices.

The processing functionality described herein may be performed by a processor located on the sensor board itself, controller 400 or the central processor responsible for running the device, for example.

Although the claimed subject matter has been fully described in connection with examples thereof with reference to the accompanying drawings, it is to be noted that various changes and modifications will become apparent to those skilled in the art. Such changes and modifications are to be understood as being included within the scope of the present disclosure as defined by the appended claims.

What is claimed is:

1. A method, comprising:
   switching operation of a sensor between a first operation mode and a second operation mode, wherein
   when operating in the first operation mode, the sensor provides a first output responsive to a force applied by an object, and
   when operating in the second operation mode, the sensor provides a second output responsive to a proximity of the object;
   using a combination of the first and second outputs and corresponding force and proximity activation thresholds to determine whether the object has pressed an input area of a device; and
   using the second output to determine whether to adjust a force baseline in accordance with the first output, wherein the force baseline is different from the activation thresholds and represents the level of force detected in the sensor when no force is being applied to the sensor.

2. The method of claim 1, further comprising
   receiving the first output when the sensor is operating in the first operation mode, and
   receiving the second output when the sensor is operating in the second operation mode.

3. The method of claim 2, further comprising
   activating an input state based on changes in the first and second received outputs.

4. The method of claim 3, further comprising
   de-activating the input state based on further changes in the first and second received outputs.

5. The method of claim 1, wherein the object is a finger.

6. A method for sensing force with capacitive discrimination, comprising:
   receiving from one or more sensors one or more signals indicating levels of force and proximity detected at an input area;
   determining whether the detected level of force exceeds a threshold amount of force;
   determining whether the detected level of proximity exceeds a threshold amount of proximity;
   if the threshold amounts of both force and proximity are determined to have been exceeded, activating a state indicating receiving a user input at the input area; and
   determining whether to adjust a force baseline in accordance with the detected levels of force based on the detected level of proximity indicated in the one or more signals, wherein the force baseline is different from the threshold amounts of force and proximity and represents the level of force detected in the sensor when no force is being applied to the sensor.

7. The method of claim 6, wherein the one or more signals indicating the detected levels of force are received from the same one or more sensors from which the one or more signals indicating the detected levels of proximity are received.

8. The method of claim 6, wherein the one or more signals indicating the detected levels of force are received from different sensors from which the one or more signals indicating the detected levels of proximity are received.

9. The method of claim 6, further comprising
receiving from any of the one or more sensors a subsequent level of proximity detected at the input area of the housing; and
deactivating the state if the subsequently detected level of proximity falls below the threshold amount of proximity.

10. The method of claim 6, further comprising
receiving from any one of the one or more sensors a subsequent level of force detected at the input area of the housing; and
deactivating the state if the subsequently detected level of force falls below the threshold amount of force.

11. The method of claim 6, further comprising
if the threshold amount of proximity is determined to have been exceeded, disabling the functionality that adjusts the force baseline accordance with the levels of force indicated in signals received from the one or more sensors.

12. The method of claim 6, further comprising
receiving from any of the one or more sensors a subsequent level of proximity detected at the input area; and
if the subsequently detected level of proximity falls below the threshold amount of proximity, enabling the functionality that adjusts the force baseline accordance with the levels of force indicated in signals received from the one or more sensors.

13. The method of claim 6, wherein the activating of the state comprises
sending a signal indicating that a virtual button displayed on the input area of the housing has been pressed.

14. A device comprising:
a sensor having at least a first mode and a second mode, the sensor providing in the first mode a first output associated with force applied to the sensor by an object, the sensor providing in the second mode a second output associated with proximity to the sensor of the object, and
a processor capable of processing the first output and the second output and determining whether the object has pressed an input area of the device based on a combination of the first and second outputs and corresponding force and proximity activation thresholds, the processor further capable of determining whether to adjust a force baseline in accordance with the first output based on the second output, wherein the force baseline is different from the activation thresholds and represents the level of force detected in the sensor when no force is being applied to the sensor.

15. A method comprising:
operating a sensor in a first mode providing a first output associated with force applied to the sensor by an object,
operating the sensor in a second mode providing a second output associated with proximity to the sensor of the object, and
processing the first output and the second output to determine whether the object has pressed an input area of a device based on a combination of the first and second outputs and corresponding force and proximity activation thresholds, and determine whether to adjust a force baseline in accordance with the first output based on the second output, wherein the force baseline is different from the activation thresholds and represents the level of force detected in the sensor when no force is being applied to the sensor.

16. A method comprising:
providing a sensor having at least a first mode and a second mode, the sensor providing in the first mode a first output associated with force applied to the sensor by an object, the sensor providing in the second mode a second output associated with proximity to the sensor of the object, and
providing a processor capable of processing the first output and the second output and determining whether the object has pressed an input area of a device based on a combination of the first and second outputs and corresponding force and proximity activation thresholds, the processor further capable of determining whether to adjust a force baseline in accordance with the first output based on the second output, wherein the force baseline is different from the activation thresholds and represents the level of force detected in the sensor when no force is being applied to the sensor.

17. The device of claim 14, wherein the processor is further configured to receive the first and second outputs from the sensor and activate or de-activate an input state based on changes in the first and second outputs.

18. The device of claim 14, wherein the processor is further configured to determine whether the first output exceeds a threshold amount of force and the second output exceeds a threshold amount of proximity.

19. The device of claim 18, wherein the processor is further configured to activate an input state if the threshold amounts of force and proximity are determined to have been exceeded.

* * * * *